United States Patent
Kamiya et al.

(10) Patent No.: US 8,119,236 B2
(45) Date of Patent: *Feb. 21, 2012

(54) DICING DIE-BONDING FILM

(75) Inventors: Katsuhiko Kamiya, Ibaraki (JP);
 Takeshi Matsumura, Ibaraki (JP);
 Shuuhei Murata, Ibaraki (JP); Hironao Ootake, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 49 days.

This patent is subject to a terminal disclaimer.

(21) Appl. No.: 12/533,272

(22) Filed: Jul. 31, 2009

(65) Prior Publication Data

US 2010/0029060 A1 Feb. 4, 2010

(30) Foreign Application Priority Data

Aug. 4, 2008 (JP) ................. 2008-200983

(51) Int. Cl.
 *B32B 7/12* (2006.01)
 *B32B 15/04* (2006.01)
(52) U.S. Cl. ............... 428/343; 428/354; 428/355
(58) Field of Classification Search .......... 428/343
 See application file for complete search history.

(56) References Cited

U.S. PATENT DOCUMENTS

| | | | |
|---|---|---|---|
| 4,961,804 A | 10/1990 | Aurichio | |
| 5,648,425 A * | 7/1997 | Everaerts et al. | 525/100 |
| 2004/0210006 A1* | 10/2004 | Doi et al. | 525/330.5 |
| 2005/0139973 A1* | 6/2005 | Matsumura et al. | 257/678 |
| 2010/0028687 A1 | 2/2010 | Kamiya et al. | |
| 2010/0029059 A1 | 2/2010 | Matsumura et al. | |
| 2010/0029061 A1 | 2/2010 | Kamiya et al. | |

FOREIGN PATENT DOCUMENTS

| | | |
|---|---|---|
| JP | 60-057642 | 4/1985 |
| JP | 2-248064 | 10/1990 |
| JP | 2005-005355 | 1/2005 |
| JP | 2006-165074 A | 6/2006 |
| JP | 2006-303472 A | 11/2006 |
| JP | 2008-009489 | 1/2008 |
| JP | 2008-159998 A | 7/2008 |

OTHER PUBLICATIONS

File History of the related U.S. Appl. No. 12/533,262, as of Feb. 23, 2010. File History of the related U.S. Appl. No. 12/533,395, as of Feb. 23, 2010.
File History of the related U.S. Appl. No. 12/533,356, as of Feb. 23, 2010.
Notification of Reasons for Refusal mailed by Japanese Patent Office on Dec. 20, 2011 in the corresponding Japanese patent application No. 2009-178030.

* cited by examiner

*Primary Examiner* — David Sample
*Assistant Examiner* — Samir Shah
(74) *Attorney, Agent, or Firm* — Knobbe, Martens, Olson & Bear LLP

(57) ABSTRACT

A dicing die-bonding film having a pressure-sensitive adhesive layer on a base and a die-bonding film on the pressure-sensitive adhesive layer, the pressure-sensitive adhesive layer comprising an acrylic polymer comprising acrylic ester A represented by $CH_2$=$CHCOOR^1$ (where $R^1$ is an alkyl group having 6-10 carbon atoms), acrylic ester B represented by $CH_2$=$CHCOOR^2$ (where $R^2$ is an alkyl group having 11 carbon atoms or more), a hydroxyl group-containing monomer, and an isocyanate compound having a radical reactive carbon-carbon double bond where the ratios of components are 40-10 mol % of the acrylic ester B with respect to 60-90 mol % of the acrylic ester A, 10-30 mol % hydroxyl group-containing monomer with respect to 100 mol % of the total of the acrylic ester A and the acrylic ester B, and 70-90 mol % isocyanate compound with respect to 100 mol % of the monomer containing a hydroxl group.

10 Claims, 3 Drawing Sheets

DICING DIE-BONDING FILM

This application claims priority to Japanese Patent Application No. 2008-200983, filed Aug. 4, 2008. The above-referenced application is hereby expressly incorporated by reference in its entirety.

BACKGROUND OF THE INVENTION

1. Field of the Invention

The present invention relates to a dicing die-bonding film that is used in dicing of a workpiece under a condition where an adhesive for fixing a chip-shaped workpiece such as a semiconductor chip and an electrode member is pasted onto a workpiece such as a semiconductor wafer before dicing, a manufacturing method thereof, and a method of manufacturing a semiconductor device using it.

2. Description of the Related Art

A semiconductor wafer (workpiece) on which a circuit pattern is formed is diced into semiconductor chips (chip-shaped workpieces) (a dicing step) after the thickness thereof is adjusted by backside polishing as necessary. In the dicing step, it is common to wash the semiconductor wafer at an appropriate liquid pressure (normally, about 2 kg/cm$^2$) to remove a cut layer. Next, the semiconductor chips are fixed onto an adherend such as a lead frame with an adhesive (amounting step), and then they are transferred to a bonding step. In the mounting step, the adhesive is applied onto the lead frame or the semiconductor chip. However, this method can hardly make an adhesive layer uniform, and a special apparatus and a long time are necessary for the application of the adhesive. Accordingly, a dicing die-bonding film is proposed that provides an adhesive layer for fixing chips that is necessary in the mounting step while adhering and holding a semiconductor wafer in the dicing step (for example, refer to Japanese Patent Application Laid-Open No. 60-57642).

The dicing die-bonding film described in Japanese Patent Application Laid-Open No. 60-57642 provides a peelable adhesive layer onto a support base. That is, the semiconductor wafer is diced while being held by the adhesive layer, the semiconductor chips are peeled off together with the adhesive layer by stretching the support base, and the individual semiconductor chips are collected and fixed onto an adherend such as a lead frame with the adhesive layer in between.

A good holding strength toward the semiconductor wafer and a good peeling property such that the semiconductor chips after dicing and the adhesive layer can be peeled off a support base integrally are desired for an adhesive layer of a dicing die-bonding film of this type so that a dicing impossibility, a dimensional error, or the like does not occur. However, it has never been easy to balance both characteristics. Especially when a large holding strength is required in the adhesive layer such as in a method of dicing a semiconductor wafer with a rotary circular blade, or the like, it is difficult to obtain a dicing die-bonding film that satisfies the above-described characteristics.

Then, in order to overcome such problems, various improved methods have been proposed (for example, refer to Japanese Patent Application Laid-Open No. 2-248064). In this document, a method is proposed that makes picking up of a semiconductor chip easy by providing an ultraviolet-ray curable pressure-sensitive adhesive layer between the support base and the adhesive layer, decreasing the adhering strength between the pressure-sensitive adhesive layer and the adhesive layer by curing the product with an ultraviolet ray after dicing, and peeling the two layers from each other.

However, even with this improved method, there is a case that it is difficult to have a dicing die-bonding film in which the holding strength during dicing and the peeling property after dicing is balanced well. For example, in the case of a large semiconductor chip that is 10 mm×10 mm or more or a very thin semiconductor chip 25 to 50 μm in thickness, the semiconductor chip cannot be picked up easily with a general die bonder because of the large area.

For such problems, Japanese Patent Application Laid-Open No. 2005-5355 discloses that the pickup property is improved by irradiating a portion corresponding to a pasting portion of a semiconductor wafer in a pressure-sensitive adhesive layer and curing the corresponding portion. However, when the dicing die-bonding film described in this document is used, there is a case that the adhesive constituting the die-bonding film overflows onto the cut face after dicing and with this the cut faces reattach to each other (blocking). As a result, there occurs a problem that pickup of a semiconductor chip becomes difficult.

SUMMARY OF THE INVENTION

The present invention has been made in view of the above-described problems, and an object thereof is to provide a dicing die-bonding film including a dicing film having a pressure-sensitive adhesive layer on a base and a die-bonding film provided on the pressure-sensitive adhesive layer, and even when the semiconductor wafer is thin, having balanced characteristics of holding strength when dicing the thin semiconductor wafer and peeling property when peeling off the semiconductor chip that is obtained by dicing and its die-bonding film integrally, a manufacturing method thereof, and a method of manufacturing a semiconductor device using it.

The inventors of the present invention investigated a dicing die-bonding film, a manufacturing method thereof, and a method for manufacturing a semiconductor device using the die-bonding film to solve the above-described conventional problem points. When a dicing die-bonding film that is produced by laminating the die-bonding film onto the pressure-sensitive adhesive layer before the ultraviolet ray irradiation is used, the adhesion at the interface of the pressure-sensitive adhesive layer and the die-bonding film is high and the anchor effect is excessively expressed; as a result, they found that there is a case where peeling becomes difficult even when the pressure-sensitive adhesive layer is cured by ultraviolet ray irradiation and the semiconductor chip is picked up.

That is, in order to solve the above-mentioned problems, the present invention relates to a dicing die-bonding film having a dicing film having a pressure-sensitive adhesive layer on a base and a die-bonding film provided on the pressure-sensitive adhesive layer, wherein the pressure-sensitive adhesive layer is formed from an acrylic polymer comprising acrylic ester A represented by $CH_2=CHCOOR^1$ (wherein $R^1$ is an alkyl group having 6 to 10 carbon atoms), acrylic ester B represented by $CH_2=CHCOOR^2$ (wherein $R^2$ is an alkyl group having 11 carbon atoms or more), a hydroxyl group-containing monomer, and an isocyanate compound having a radical reactive carbon-carbon double bond within a molecular, the compounded ratio of the acrylic ester A and the acrylic ester B is 40 to 10 mol % of the acrylic ester B with respect to 60 to 90 mol % of the acrylic ester A, the compounded ratio of the hydroxyl group-containing monomer is in the range of 10 to 30 mol % with respect to 100 mol % of the total of the acrylic ester A and the acrylic ester B, the compounded ratio of the isocyanate compound is in the range of 70 to 90 mol % with respect to 100 mol % of the hydroxyl group-containing monomer, the pressure-sensitive adhesive layer is cured by ultraviolet ray irradiation, and the die-bonding film is formed from an epoxy resin and is laminated on the pressure-sensitive adhesive layer after the ultraviolet ray irradiation.

The pressure-sensitive adhesive layer is formed by curing with the ultraviolet ray irradiation in advance before laminating with the die-bonding film. Therefore, the surface of the pressure-sensitive adhesive layer is hard, and when laminated with the die-bonding film, the degree of adhesion of the both can be decreased. Accordingly, the anchoring effect between the pressure-sensitive adhesive layer and the die-bonding film is decreased, and the peeling property between the pressure-sensitive adhesive layer and the die-bonding film becomes good when picking up a semiconductor chip, for example. As a result, an improvement of the pickup property can be attempted. Further, when the pressure-sensitive adhesive layer is cured by ultraviolet ray irradiation, a crosslinking structure is formed, and therefore, the volume of the pressure-sensitive adhesive layer is reduced. Therefore, when the pressure-sensitive adhesive layer is cured, the pressure-sensitive adhesive layer is cured by irradiating the ultraviolet ray after laminating to the die-bonding film, and stress is applied onto the die-bonding film. As a result, warping may occur over the entire dicing die-bonding film. However, since the dicing die-bonding film of the present invention is formed by laminating the pressure-sensitive adhesive layer with the die-bonding film after curing by ultraviolet ray irradiation, the die-bonding film can be prevented from undergoing an unnecessary stress. As a result, a dicing die-bonding film without warping can be obtained.

Since the die-bonding film is formed from an epoxy resin, the adhesive constituting the die-bonding film is prevented from overflowing onto the cut face even when the die-bonding film is cut together with the semiconductor wafer by dicing, for example. With this, the cut faces are prevented from re-attaching (blocking) to each other, and the pickup of the semiconductor chip can be made to be further better.

An acrylic polymer that forms the pressure-sensitive adhesive layer contains acrylic ester A represented by $CH_2=CHCOOR^1$ (wherein $R^1$ is an alkyl group having 6 to 10 carbon atoms) and acrylic ester B represented by $CH_2=CHCOOR^2$ (wherein $R^2$ is an alkyl group having 11 carbon atoms or more) at a compounded ratio of 40 to 10 mol % of acrylic ester B with respect to 60 to 90 mol % of acrylic ester A. By setting the compounded ratio of acrylic ester A to 90 mol % or less and setting the compounded ratio of acrylic ester B to 10 mol % or more, the peeling property after ultraviolet ray curing of the pressure-sensitive adhesive layer to the die-bonding film can be improved and the pickup property when picking up the semiconductor chip is made good. On the other hand, setting the compounded ratio of acrylic ester A to 60 mol % or more and setting the compounded ratio of acrylic ester B to 40 mol % or less, tackiness of the dicing film and the die-bonding film before the ultraviolet ray curing is made good, and prevention of peeling can be attempted. Further, by setting the compounded ratio of a hydroxyl group-containing monomer to 10 mol % or more with respect to 100 mol % of the total of acrylic ester A and acrylic ester B, crosslinking after the ultraviolet ray curing is prevented from being insufficient. As a result, an adhesive residue is prevented from occurring on a dicing ring that is laminated onto the pressure-sensitive adhesive layer when dicing, for example. On the other hand, by setting the compounded ratio to 40 mol % or less, the pickup property can be prevented from deterioration that is due to the peeling property becoming difficult by crosslinking due to the ultraviolet ray irradiation proceeding excessively. Productivity can be also prevented from decreasing due to partial gelatinization of the polymer.

Since an isocyanate compound having a radical reactive carbon-carbon double bond within a molecular in place of a multi-functional monomer is adopted in the present invention, there is no material diffusion of the multi-functional monomer in the die-bonding film. As a result, the interface between the dicing film and the die-bonding film is prevented from disappearing, and an even better pickup property is made possible.

It is preferable that the cumulative radiation of the ultraviolet ray irradiation is in a range of 30 to 1000 mJ/cm². By setting the cumulative radiation during ultraviolet ray irradiation to 30 mJ/cm² or more, the pressure-sensitive adhesive layer is sufficiently cured and is prevented from excessively adhering to the die-bonding film. As a result, a good pickup property can be obtained, and attaching of the pressure-sensitive adhesive (so-called adhesive residue) on the die-bonding film after picking up can be prevented. On the other hand, by setting the cumulative radiation to 1000 mJ/cm² or less, thermal damage to the base can be reduced. It can be prevented that the expansion property deteriorates due to the tensile modulus becoming too large by the curing of the pressure-sensitive adhesive layer proceeding excessively. The adhesive strength is prevented from becoming too low, and therefore, the generation of chip fly can be prevented when a workpiece is diced.

It is preferable that the hydroxyl group-containing monomer is at least any one selected from a group consisting of 2-hydroxyethyl (meth)acrylate, 2-hydroxypropyl (meth)acrylate, 4-hydroxybutyl (meth)acrylate, 6-hydroxyhexyl (meth)acrylate, 8-hydrorxyoctyl (meth)acrylate, 10-hydroxydecyl (meth)acrylate, 12-hydroxylauryl (meth)acrylate, and (4-hydroxymethylcyclohexyl)methyl (meth)acrylate.

It is also preferable that the isocyanate compound having a radical reactive carbon-carbon double bond is at least one of 2-methacryloyloxyethyl isocyanate and 2-acrylolyloxyethyl isocyanate.

It is also preferable that the weight average molecular weight of the acrylic polymer is in a range of 350,000 to 1,000,000. By setting the weight average molecular weight to 350,000 or more, the acrylic polymer is prevented from becoming a low molecular weight polymer, and accordingly, peeling from the dicing ring that is laminated onto the pressure-sensitive adhesive layer can be prevented from occurring during dicing, for example. Furthermore, because the crosslinking after ultraviolet ray irradiation is prevented from becoming insufficient, the adhesive residue can be prevented from occurring when peeling the dicing ring from the pressure-sensitive adhesive layer. On the other hand, by setting the weight average molecular weight to 1,000,000 or less, workability when forming the pressure-sensitive adhesive layer onto the base can be improved. The formation of the pressure-sensitive adhesive layer is performed by applying a solution of a pressure-sensitive adhesive composition formed from the above-described acrylic polymer onto the base and then drying, for example. This is because the workability during polymerization and application of the acrylic polymer decreases when the weight average molecular weight of the acrylic polymer exceeds 1,000,000 because the viscosity of the solution of the pressure-sensitive adhesive composition becomes too large.

It is also preferable that the tensile modulus at 23° C. of the pressure-sensitive adhesive layer after ultraviolet ray irradiation is in the range of 7 to 170 MPa. By setting the tensile modulus (23° C.) after ultraviolet ray irradiation 7 MPa or more, a good pickup property can be maintained. On the other hand, by setting the tensile modulus 170 MPa or less, chip fly in dicing can be suppressed from occurring.

It is also preferable that the acrylic polymer constituting the pressure-sensitive adhesive layer does not contain an acrylic acid as a monomer component. Accordingly, the reaction and the interaction of the pressure-sensitive adhesive layer and the die-bonding film can be prevented, and the pickup property can be further improved.

In order to solve the above-mentioned problems, the present invention relates to a method for manufacturing a dicing die-bonding film having a dicing film having a pressure-sensitive adhesive layer on a base and a die-bonding film provided on the pressure-sensitive adhesive layer, comprising a step of forming a pressure-sensitive adhesive layer precursor on the base, wherein the precursor is formed from an acrylic polymer comprising acrylic ester A represented by $CH_2$=$CHCOOR^1$ (wherein $R^1$ is an alkyl group having 6 to 10 carbon atoms), acrylic ester B represented by $CH_2$=$CHCOOR^2$ (wherein $R^2$ is an alkyl group having 11 carbon atoms or more), and a hydroxyl group-containing monomer on the base and wherein the compounded ratio of the acrylic ester A and the acrylic ester B is 40 to 10 mol % of the acrylic ester B with respect to 60 to 90 mol % of the acrylic ester A, the compounded ratio of the hydroxyl group-containing monomer is in the range of 10 to 30 mol % with respect to 100 mol % of the total of the acrylic ester A and the acrylic ester B, and the compounded ratio of isocyanate compound is in the range of 70 to 90 mol % with respect to 100 mol % of the monomer containing a hydroxl group, and comprising a step of forming the pressure-sensitive adhesive layer by irradiating the pressure-sensitive adhesive layer precursor with an ultraviolet ray, and a step of laminating the die-bonding film onto the pressure-sensitive adhesive layer.

The pressure-sensitive adhesive layer of the dicing film is cured in advance by the ultraviolet ray irradiation before laminating with the die-bonding film. Therefore, the surface of the pressure-sensitive adhesive layer is hard, and is in a state that adhesion to an uneven surface is decreased. Since the dicing die-bonding film is produced by laminating the die-bonding film to such pressure-sensitive adhesive layer in the present invention, the anchoring effect is reduced by decreasing the adhesion between the pressure-sensitive adhesive layer and the die-bonding film. As a result, a dicing die-bonding film having an excellent peeling property between the pressure-sensitive adhesive layer and the die-bonding film and exhibiting a good pickup property when picking up the semiconductor chip, for example, can be achieved. When the pressure-sensitive adhesive layer is cured by ultraviolet ray irradiation, the volume of the pressure-sensitive adhesive reduces due to the formation of a crosslinking structure. Therefore, when the pressure-sensitive adhesive layer is irradiated with the ultraviolet ray and cured after laminating with the die-bonding film, stress is applied onto the die-bonding film, and as a result, there is a case where warping occurs over the entire dicing die-bonding film. However, since the dicing die-bonding film of the present invention is formed by laminating the pressure-sensitive adhesive layer with the die-bonding film after curing by ultraviolet ray irradiation, the die-bonding film can be prevented from undergoing of an unnecessary stress. As a result, a dicing die-bonding film without warping can be obtained.

Since an epoxy resin is used as a constituting material of the die-bonding film in the above-described method, for example, when dicing a semiconductor wafer, a die-bonding film that can prevent overflow of the adhesive from occurring onto the cut face is formed even when the semiconductor wafer and the die-bonding film are cut. As a result, the cut faces of the die-bonding film are prevented from re-attaching to each other (blocking), and thus, a dicing die-bonding film having an excellent pickup property can be produced.

An acrylic polymer that forms the pressure-sensitive adhesive layer contains acrylic ester A represented by $CH_2$=$CHCOOR^1$ (wherein $R^1$ is an alkyl group having 6 to 10 carbon atoms) and acrylic ester B represented by $CH_2$=$CHCOOR^2$ (wherein $R^2$ is an alkyl group having 11 carbon atoms or more) at a compounded ratio of 40 to 10 mol % of acrylic ester B with respect to 60 to 90 mol % of acrylic ester A. By setting the compounded ratio of acrylic ester A to 90 mol % or less and setting the compounded ratio of acrylic ester B to 10 mol % or more, the peeling property after ultraviolet ray curing of the pressure-sensitive adhesive layer to the die-bonding film can be improved and the pickup property when picking up the semiconductor chip is made good. On the other hand, by setting the compounded ratio of acrylic ester A to 60 mol % or more and setting the compounded ratio of acrylic ester B to 40 mol % or less, tackiness of the dicing film and the die-bonding film before the ultraviolet ray curing is made good, and prevention of peeling can be attempted. By setting the compounded ratio of a hydroxyl group-containing monomer 10 mol % or more with respect to 100 mol % of the total of acrylic ester A and acrylic ester B, crosslinking after the ultraviolet ray curing is prevented from being insufficient. As a result, an adhesive residue is prevented from occurring on a dicing ring that is laminated onto the pressure-sensitive adhesive layer when dicing, for example. On the other hand, by setting the compounded ratio to 30 mol % or less, the pickup property can be prevented from deterioration that is due to peeling becoming difficult by crosslinking due to the ultraviolet ray irradiation proceeding excessively. Further, productivity can be prevented from decreasing due to partial gelatinization of the polymer.

Since an isocyanate compound having a radical reactive carbon-carbon double bond within a molecular in place of the multi-functional monomer is adopted in the present invention, there is no material diffusion of a multi-functional monomer into the die-bonding film. As a result, the interface between the dicing film and the die-bonding film is prevented from disappearing, and an even better pickup property is made possible.

The irradiation by ultraviolet ray is preferably performed in the range of 30 to 1000 mJ/cm$^2$. By setting the irradiation of ultraviolet to 30 mJ/cm$^2$ or more, the pressure-sensitive adhesive layer is sufficiently cured and is prevented from excessively adhering to the die-bonding film. As a result, a good pickup performance can be obtained, and attaching of the pressure-sensitive adhesive (so-called adhesive residue) on the die-bonding film after picking up can be prevented. On the other hand, by setting the irradiation by ultraviolet to 1000 mJ/cm$^2$ or less, thermal damage to the base can be reduced. It can be prevented that the expansion property deteriorates due to the tensile modulus becoming too large by the curing of the pressure-sensitive adhesive layer proceeding excessively. The adhesive strength is prevented from becoming too low, and accordingly, the generation of chip fly is prevented when a workpiece is diced.

In order to solve the above-mentioned problems, the present invention relates to a method of manufacturing a semiconductor device using a dicing die-bonding film comprising a dicing film having a pressure-sensitive adhesive layer on a base and a die-bonding film provided on the pressure-sensitive adhesive layer, wherein the dicing die-bonding film is prepared, and comprising a step of press-pasting a semiconductor wafer onto the die-bonding film, a step of forming a semiconductor chip by dicing the semiconductor wafer together with the die-bonding film, and a step of peeling the semiconductor chip together with the die-bonding film off the pressure-sensitive adhesive layer, and wherein the pressure-sensitive adhesive layer is not irradiated with the ultraviolet ray from the step of press-pasting the semiconductor wafer to the step of peeling off the semiconductor chip.

Since a dicing die-bonding film preventing chip fly of a semiconductor chip from occurring when dicing a semiconductor wafer and having an excellent pickup property is used in the above-described method, a semiconductor chip can be easily peeled off from the dicing film together with the die-bonding film even in the case of a large semiconductor chip that is 10 mm×10 mm or more or a very thin semiconductor chip of 25 to 75 μm thickness, for example. That is, when the above-described method is used, a semiconductor device can be manufactured with an increased yield.

Further, it is not necessary to irradiate the pressure-sensitive adhesive layer with the ultraviolet ray before picking up with this method. As a result, the number of steps can be reduced as compared with the conventional method for manufacturing a semiconductor device. Even in the case of the semiconductor wafer having a prescribed circuit pattern, the generation of circuit pattern failure caused by irradiation with the ultraviolet ray can be prevented. As a result, a semiconductor device having high reliability can be manufactured.

Since a dicing die-bonding film having a die-bonding film using an epoxy resin as a constituting material is used in the above-described method, re-attaching (blocking) of the cut faces caused by overflow of the adhesive onto the cut faces of the die-bonding film can be prevented even when dicing the semiconductor wafer. As a result, peeling of the semiconductor chip becomes further easier, and an increase of the yield can be attempted.

DETAILED DESCRIPTION OF THE PREFERRED EMBODIMENTS (Dicing Die-Bonding Film)

Figure 1:
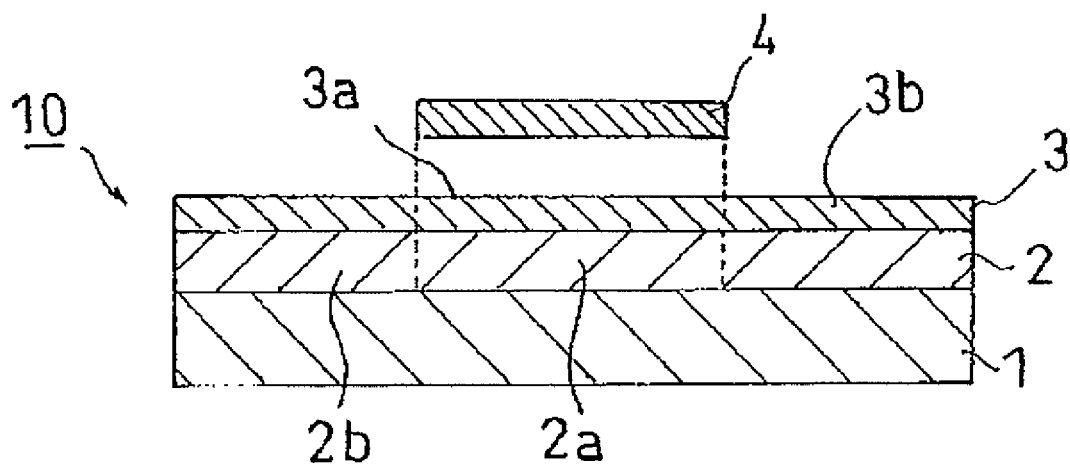
FIG. 1 is a cross-sectional schematic drawing showing a dicing die-bonding film according to one embodiment of the present invention.
Figure 2:
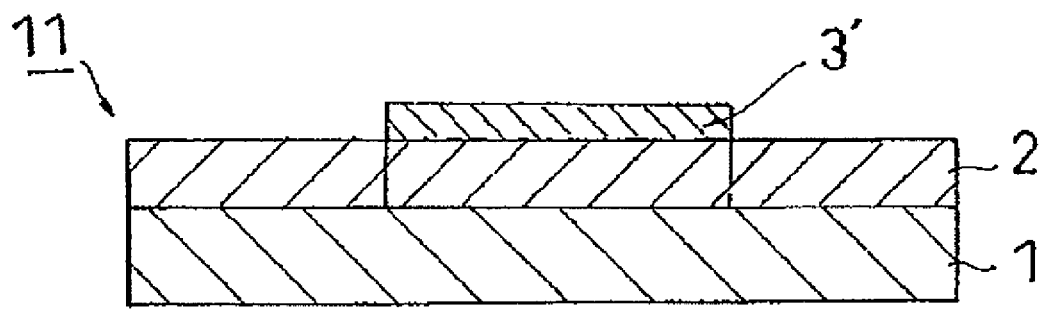
FIG. 2 is a cross-sectional schematic drawing showing another dicing die-bonding film according to another embodiment of the present invention.
Figure 3A:
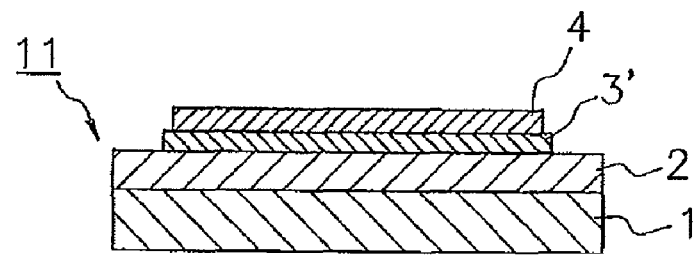
FIG. 3A is a cross-sectional schematic drawing showing an example in which a semiconductor wafer is mounted on the dicing die-bonding film with the die-bonding film interposed therebetween.
Figure 3B:
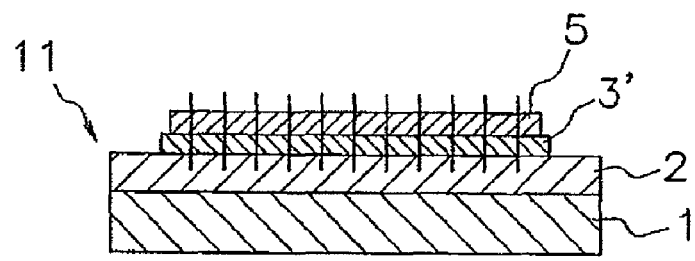
FIG. 3B is a cross-sectional schematic drawing showing an example in which the semiconductor wafer is diced into semiconductor chips.
Figure 3C:
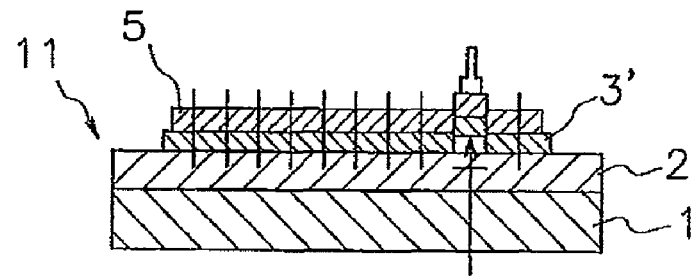
FIG. 3C is a cross-sectional schematic drawing showing an example in which the semiconductor chip is pushed up with a needle.
Figure 3D:
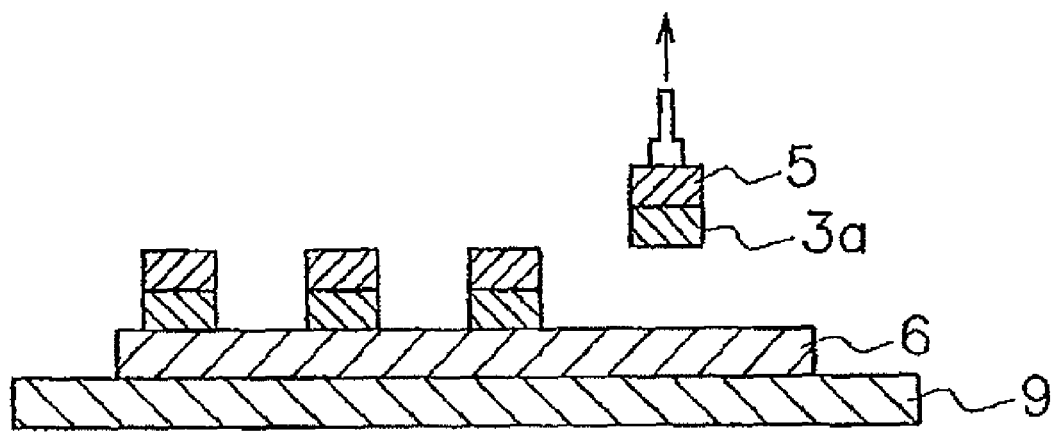
FIG. 3D is a cross-sectional schematic drawing showing an example in which the semiconductor chip is picked up.
Figure 3E:
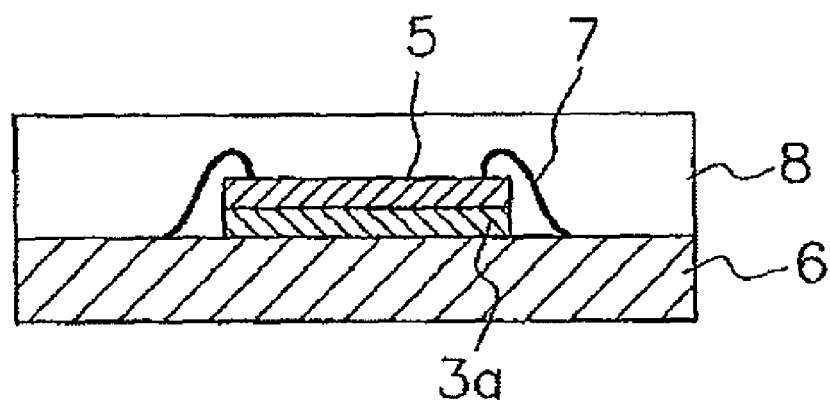
FIG. 3E is a cross-sectional schematic drawing showing an example in which the semiconductor chip is adhered and fixed to an adherend, and furthermore, the semiconductor chip is sealed with a sealing resin.

An embodiment of the present invention is described referring to FIGS. 1 and 2. FIG. 1 is a sectional schematic drawing showing a dicing die-bonding film of the present embodiment. FIG. 2 is a sectional schematic drawing showing another dicing die-bonding film of the present embodiment. Parts that are unnecessary to explain are omitted, and there are parts that are drawn by magnifying or minifying to make the explanation easy.

As shown in FIG. 1, a dicing die-bonding film 10 has a configuration having a dicing film in which a pressure-sensitive adhesive layer 2 is provided on a base 1 and a die-bonding film 3 on the pressure-sensitive adhesive layer 2. Alternatively, as shown in FIG. 2, the present invention may have a configuration in which a die-bonding film 3' is formed only on a semiconductor wafer pasting portion.

The base 1 confers strength on the dicing die-bonding film 10, 11. Examples of the base film include polyolefins such as low-density polyethylene, linear polyethylene, middle-density polyethylene, high-density polyethylene, ultra-low-density polyethylene, random copolymerization polypropylene, block copolymerization polypropylene, homopolypropylene, polybutene, polymethyl pentene etc., polyesters such as ethylene/vinyl acetate copolymer, ionomer resin, ethylene/(meth)acrylic acid copolymer, ethylene/(meth)acrylate (random, alternating) copolymer, ethylene/butane copolymer, ethylene/hexene copolymer, polyurethane, polyethylene terephthalate, polyethylene naphthalate etc., polycarbonate, polyimide, polyether ether ketone, polyimide, polyether imide, polyamide, every aromatic polyamide, polyphenyl sulfide, aramid (paper), glass, glass cloth, fluorine resin, polyvinyl chloride, polyvinylidene chloride, cellulose resin, silicone resin, metal (foil), paper etc.

Further, an example of a material of the base 1 is a polymer such as a crosslinked body of the above-described resins. When the base 1 is composed of a plastic film, the plastic film may be used in a non-stretched form or after subjection if necessary to uniaxial or biaxial stretching treatment. According to a resin sheet endowed with thermal shrinkability by stretching treatment, the base 1 can be thermally shrunk after dicing thereby reducing the contact area between the pressure-sensitive adhesive layer 2 and the die-bonding film 3,3' to facilitate the recovery of semiconductor chips.

The surface of the base 1 can be subjected to ordinary surface treatment for improving adhesion and maintenance of the adjacent layer, for example chemical or physical treatment such as treatment with chromate, exposure to ozone, exposure to flames, high-voltage electric shock exposure, and treatment with ionization radiations, or coating treatment with a undercoat (for example, a sticky material described later).

The same or different kinds of the base 1 can be suitably selected and used. The substrate material may be a single layer or multilayer or may be a blend substrate material having two or more kinds of resins dry-blended therein. The multilayer film can be produced from the above resin etc. by a conventional film lamination method such as co-extrusion method, dry lamination method etc. The base 1 can be provided thereon with a evaporated layer of about 30 to 500 Å consisting of an electroconductive material such as a metal, an alloy and an oxide thereof in order to confer antistatic performance. The base 1 may be a single layer or a multilayer consisting of two or more layers.

The thickness of the base 1 can be suitably determined without particular limitation, and is generally preferably about 5 to 200 μm.

The pressure-sensitive adhesive layer 2 is formed by an ultraviolet ray curing-type adhesive, and it is cured by the ultraviolet ray irradiation in advance. The cured portion is not necessarily the entire region of the pressure-sensitive adhesive layer 2, and at least a portion 2a corresponding to a semiconductor wafer pasting portion 3a of the pressure-sensitive adhesive layer 2 may be cured (see FIG. 1). Because the pressure-sensitive adhesive layer 2 is cured by the ultraviolet ray irradiation before pasting with a die bond film 3, the surface thereof is hard, and the adhesion is suppressed from becoming excessively high at the interface of the pressure-sensitive adhesive layer 2 and the die bond film 3. Thus, the anchoring effect between the pressure-sensitive adhesive layer 2 and the die bond film 3 is decreased, and the peeling property can be improved.

By curing the ultraviolet ray curing-type pressure-sensitive adhesive layer 2 matching in the shape of a die bond film 3' shown in FIG. 2 in advance, the adhesion is suppressed from being excessively high at the interface of the pressure-sensitive adhesive layer 2 and the die bond film 3. Thus, the die bond film 3' has a characteristic of peeling easily off the pressure-sensitive adhesive layer 2 upon picking up. On the other hand, the other portion 2b of the pressure-sensitive adhesive layer 2 is non-cured because the ultraviolet ray has not irradiated it, and the adhesive strength is higher than the portion 2a. Thus, when pasting a dicing ring 12 to the other portion 2b, the dicing ring 12 can be certainly adhered and fixed.

As described above, in the pressure-sensitive adhesive layer 2 of the dicing die-bonding film 10 shown in FIG. 1, the portion 2b that is formed from a non-cured ultraviolet-ray curing-type pressure-sensitive adhesive adheres to the die-bonding film 3, and the holding strength upon dicing can be secured. In such a way, the ultraviolet-ray curing-type pressure-sensitive adhesive can support the die-bonding film 3 for fixing a semiconductor chip to an adherend such as a substrate with a good balance of adhesion and peeling. In the pressure-sensitive adhesive layer 2 of a dicing die-bonding film 11 shown in FIG. 2, the portion 2b can fix a dicing ring. A dicing ring that is made from a metal such as stainless steel or a resin can be used, for example.

In the dicing die-bonding film 10 when a semiconductor wafer is pasted to the die-bonding film 3, the adhesive strength of the portion 2a in the pressure-sensitive adhesive layer 2 to the semiconductor wafer pasting portion 3a is preferably designed to be smaller than the adhesive strength of the other portion 2b to a portion 3b that differs from the semiconductor wafer pasting portion 3a. The peeling adhesive strength of the portion 2a under a condition of a normal temperature of 23° C., a peeling angle of 15 degree, and a peeling speed of 300 mm/min is preferably 0.5 to 0.9 N/10 mm from the viewpoints of fixing and holding strength of the wafer, recovering property of a chip that is formed, and the like. When the adhesive strength is less than 0.5N/10 mm, the adhesion and fixing of a semiconductor chip becomes insufficient, and therefore chip fly may be generated upon dicing. When the adhesive strength exceeds 0.9 N/10 mm, the pressure-sensitive adhesive layer 2 excessively adheres the die-bonding film 3, and therefore the picking up of the semiconductor chip may become difficult. On the other hand, the adhesive strength of the other portion 2b is preferably 0.5 to 10 N/10 mm, and more preferably 1 to 5 N/10 mm. Even when the portion 2a has low adhesive strength, the generation of chip fly or the like can be suppressed by the adhesive strength of the other portion 2b, and the holding strength that is necessary for a wafer process can be exhibited.

In the dicing die-bonding film 11, the adhesive strength of the portion 2a in the pressure-sensitive adhesive layer 2 to the semiconductor wafer pasting portion 3a is preferably designed to be smaller than the adhesive strength of the other portion 2b to a dicing ring 12. The peeling adhesive strength of the portion 2a to the semiconductor pasting portion 3a (at a normal temperature of 23° C., a peeling angle of 15 degree, and a peeling speed of 300 mm/min) is preferably 0.5 to 0.9 N/10 mm as the same as described above. On the other hand, the adhesive strength of the other portion 2b to the dicing ring 12 is preferably 0.05 to 10 N/10 mm, and more preferably 0.1 to 5 N/1 mm. Even when the portion 2a has low adhesive strength, the generation of chip fly or the like can be suppressed by the adhesive strength of the other portion 2b, and the holding strength that is necessary for a wafer process can be exhibited. These adhesive strengths are based on a measured value at a normal temperature of 23° C., a peeling angle of 15 degrees, and a tensile (peeling) speed of 300 mm/min.

In the dicing die-bonding films 10, 11, the adhesive strength of the wafer pasting portion 3a to the semiconductor wafer is preferably designed to be larger than the adhesive strength of the wafer pasting portion 3a to the portion 2a. The adhesive strength to the semiconductor wafer is appropriately adjusted depending on its type. The adhesive strength of the semiconductor wafer pasting portion 3a to the portion 2a (at a normal temperature of 23° C., a peeling angle of 15 degrees, and a peeling speed of 300 mm/min) is preferably 0.05 to 10 N/10 mm, and more preferably 1 to 5 N/10 mm. On the other hand, the adhesive strength of the semiconductor wafer pasting portion 3a to the semiconductor wafer (at a normal temperature of 23° C., a peeling angle of 15 degrees, and a peeling speed of 300 mm/min) is preferably 0.5 to 15 N/10 mm, and more preferably 1 to 15 N/10 mm from the viewpoints of reliability upon dicing, picking up and die bonding as well as the pickup property.

When the diameter of a semiconductor wafer 4 is made to be $r_2$, the diameter of the portion 2a in the pressure-sensitive adhesive layer 2 is made to be $r_2$, and the diameter of the semiconductor wafer pasting portion 3a in the die-bonding film 3 (or the die-bonding film 3') is made to be $r_3$, a relationship of $r_1 < r_2 < r_3$ is preferably satisfied. Thus, the entire face of the semiconductor wafer 4 can be adhered and fixed onto the die-bonding films 3, 3', and the peripheral part of the semiconductor wafer pasting portion 3a (or the die-bonding film 3') can be adhered and fixed to the other portion 2b. Because the adhesive strength of other portion 2b is higher than that of the portion 2a, the semiconductor wafer pasting portion 3a (or the die-bonding film 3') can be adhered and fixed at the peripheral part. As a result, the generation of chip fly can be further prevented upon dicing.

The ultraviolet ray curing-type pressure-sensitive adhesive is an internal-type ultraviolet ray curing-type adhesive that uses a base polymer having a radical reactive carbon-carbon double bond in a polymer side chain or a main chain or the ends of the main chain. Because the internal-type ultraviolet-ray curing-type adhesive does not have to include or does not include in a large amount an oligomer component or the like that is a low molecular weight component, the oligomer component or the like does not travel in the pressure-sensitive adhesive over time, and a pressure-sensitive adhesive layer having a stable layer structure can be formed.

In the present invention, the acrylic polymer includes the acrylic ester A, the acrylic ester B, the hydroxyl group-containing monomer, and the isocyanate compound having a radical reactive carbon-carbon double bond within a molecular.

The acrylic ester A is represented by a chemical formula $CH_2=CHCOOR^1$ (wherein $R^1$ is an alkyl group having 6 to 10 carbon atoms and more preferably having 8 to 9 carbon atoms). When the number of carbon atoms is less than 6, the peeling strength becomes too large, and there is a case where the pickup property deteriorates. The acrylic ester B is represented by a chemical formula $CH_2=CHCOOR^2$ (wherein $R^2$ is an alkyl group having 11 carbon atoms or more, more preferably having 12 to 26 carbon atoms, and further preferably 16 to 22 carbon atoms). By including such a long-chain alkyl monomer, polarity of the pressure-sensitive adhesive is reduced, and the peeling property after ultraviolet ray curing can be improved.

The compounded ratio is 40 to 10 mol % of acrylic ester B with respect to 60 to 90 mol % of acrylic ester A. When the compounded ratio of the acrylic ester A exceeds 90 mol % and the compounded ratio of the acrylic ester B becomes less than 10 mol %, the peeling property of a pressure-sensitive adhesive layer 2 after ultraviolet ray curing to a die-bonding film 3 deteriorates and deterioration of the pickup property when picking up the semiconductor chip is brought about. On the other hand, when the compounded ratio of the acrylic ester A becomes less than 60 mol % and the compounded ratio of the acrylic ester B exceeds 40 mol %, tackiness of the pressure-sensitive adhesive layer 2 to the die-bonding film 3 decreases, and there is a case where chip fly occurs when dicing.

Specific examples of the acrylic ester A include acrylic alkyl esters in which an alkyl group has 6 to 10 carbon atoms, especially 8 to 9 carbon atoms, such as acrylic hexyl ester, acrylic heptyl ester, acrylic octyl ester, acrylic 2-ethylhexyl ester, acrylic isooctyl ester, acrylic nonyl ester, acrylic isononyl ester, acrylic decyl ester, acrylic isodecyl ester. Furthermore, among the monomers represented by the above-described chemical formulae, acrylic 2-ethylhexyl and acrylic isooctyl are especially preferable.

The acrylic ester B may be any acrylic alkyl esters that an alkyl group has 11 carbon atoms or more. The alkyl group preferably has 12 carbon atoms or more, especially 16 carbon atoms. The upper limit of the number of the alkyl group is not particular limitation. The alkyl group preferably has 30 carbon atoms or less, more preferably 26 carbon atoms or less, especially 22 carbon atoms or less. Specific examples of the acrylic ester B include dodecyl acrylate, tridecyl acrylate, tetradecyl acrylate, hexadecyl acrylate, octadecyl acrylate, eicosyl acrylate and behenyl acrylate. These monomers may be used alone or two types or more may be used together.

A hydroxyl group-containing monomer that is capable of copolymerizing with the acrylic ester A and the acrylic ester B is used in the acrylic polymer as an essential component. Examples of the hydroxyl group-containing monomer include 2-hydroxyethyl (meth)acrylate, 2-hydroxypropyl (meth)acrylate, 4-hydroxybutyl (meth)acrylate, 6-hydroxyhexyl (meth)acrylate, 8-hydrorxyoctyl (meth)acrylate, 10-hydroxydecyl (meth)acrylate, 12-hydroxylauryl (meth)acrylate, and (4-hydroxymethylcyclohexyl)methyl (meth)acrylate. These hydroxyl group-containing monomers may be used alone or two types or more may be used together.

The compounded ratio of the hydroxyl group-containing monomer is preferably in the range of 10 to 40 mol % to the total 100 mol % of the acrylic ester A and the acrylic ester B, and more preferably in the range of 15 to 30 mol %. When the compounded ratio is less than 10 mol %, crosslinking after ultraviolet ray curing becomes insufficient, and there is a case where the pickup property deteriorates. On the other hand, when the compounded ratio exceeds 40 mol %, peeling becomes difficult because the polarity of the pressure-sensitive adhesive becomes high and its interaction with the die-bonding film becomes large.

The acrylic polymer may include a unit corresponding to another monomer component that is capable of copolymerizing with the acrylic alkyl ester as necessary for the purpose of improving cohesive strength and heat resistance. Examples of such a monomer component include acrylic alkyl esters such as methyl acrylate, ethyl acrylate, propyl acrylate, isopropyl acrylate, butyl acrylate, isobutyl acrylate, t-butyl acrylate, s-butyl acrylate and pentyl acrylate; methacrylic alkyl esters such as methyl methacrylate, ethyl methacrylate, propyl methacrylate, isopropyl methacrylate, butyl methacrylate, isobutyl methacrylate, t-butyl methacrylate, s-butyl methacrylate and pentyl methacrylate; carboxyl group-containing monomers such as acrylic acid, methacrylic acid, carboxyethyl (meth)acrylate, carboxypentyl (meth)acrylate, itaconic acid, maleic acid, fumaric acid, and crotonic acid; acid anhydride monomers such as maleic anhydride and itaconic anhydride; sulfonic acid group-containing monomers such as stylenesulfonic acid, allylsulfonic acid, 2-(meth)acrylamide-2-methylpropanesulfonic acid, (meth)acrylamidepropanesulfonic acid, sulfopropyl (meth)acrylate, and (meth)acryloyloxynaphthalenesulfonic acid; phosphate group-containing monomers such as 2-hydroxyethylacryloylphosphate; acrylamide; acrylnitrile; acrylic cycloalkyl ester such as cyclohexyl ester; and methacrylic cycloalkyl ester. One type or two types or more of these copolymerizable monomer components can be used. The amount of use of these copolymerizable monomers is preferably 40% by weight or less to the total monomer components. However, in the case of the carboxyl group-containing monomers, by its carboxyl group reacting with an epoxy group in an epoxy resin in the die-bonding film 3, the interface of the pressure-sensitive adhesive layer 2 and the die-bonding film 3 disappears, and the peeling property of both the pressure-sensitive adhesive layer 2 and the die-bonding film 3 may deteriorate. Therefore, the amount of use of the carboxyl group-containing monomers is preferably 0 to 3% by weight or less of the total monomer component. Further, among these monomer components, the acrylic polymer constituting the pressure-sensitive adhesive layer 2 of the present invention preferably does not include acrylic acid as a monomer component. There is a case that the peeling property deteriorates by disappearance of the interface between the pressure-sensitive adhesive layer 2 and the die-bonding film 3 by material diffusion of acrylic acid into the die-bonding film 3.

The acrylic polymer does not preferably include a multi-functional monomer as a monomer component for copolymerization. Accordingly, there is no material diffusion of the multi-functional monomer into the die-bonding film, the deterioration of the pickup property due to the boundary face of the pressure-sensitive adhesive layer 2 and the die-bonding film 3 disappearing can be prevented.

Further, an isocyanate compound having a radical reactive carbon-carbon double bond within a molecular is used in the acrylic polymer as an essential component. Examples of the isocyanate compound include methacryloyl isocyanate, 2-methacryloyloxyethyl isocyanate, 2-acryloyloxyethyl isocyanate, and m-isopropenyl-$\alpha,\alpha$-dimethylbenzyl isocyanate.

The compounded ratio of the isocyanate compound having a radial reactive carbon-carbon double bond is preferably in a range of 70 to 90 mol %, and more preferably in a range of 75 to 85 mol % to 100 mol % of the hydroxyl group-containing monomer. When the compounded ratio is less than 70 mol %, crosslinking after ultraviolet-ray curing becomes insufficient, and an adhesive residue occurs to the dicing ring that is pasted on the pressure-sensitive adhesive layer upon dicing. On the other hand, when the compounded ratio exceeds 90 mol %, peeling becomes difficult because the polarity of the pressure-sensitive adhesive becomes high and the interaction with the die-bonding film becomes intense, and the pickup property deteriorates.

The acrylic polymer can be obtained by polymerizing the monomer mixture described above. The polymerization can be performed by any of the methods such as solution polymerization, emulsion polymerization, bulk polymerization, and suspension polymerization. The content of a low molecular weight material is preferably small from the viewpoint of minimizing the contamination of a clean adherend, or the like. In this respect, the weight average molecular weight of the acrylic polymer is preferably 350,000 to 1,000,000, and more preferably about 450,000 to 800,000. The measurement of the weight average molecular weight is performed by GPC (Gel Permeation Chromatography), and the value of the weight average molecular weight is calculated by polystyrene conversion.

Further, an external crosslinking agent can be appropriately adopted in the pressure-sensitive adhesive to adjust the adhesive strength before and after the ultraviolet ray irradiation. A specific method of external crosslinking is a method of adding and reacting a so-called crosslinking agent such as a polyisocyanate compound, an epoxy compound, an aziridine compound, or a melamine-based crosslinking agent. In the case of using an external crosslinking agent, its amount of use is appropriately determined by a balance with the base polymer that has to be crosslinked and further by the usage as a pressure-sensitive adhesive. In general, the amount is about 20 parts by weight or less to 100 parts by weight of the base polymer, and further, it is preferably compounded at 0.1 to 10 parts by weight. Furthermore, various conventionally known additives such as a tackifier and an anti-aging agent other than the above-described components may be used in the pressure-sensitive adhesive as necessary.

The method of introducing the radical reactive carbon-carbon double bond to the acrylic polymer is not especially limited, and various methods can be adopted. However, it is easy to introduce the radical reactive carbon-carbon double bond to the polymer side chain from the viewpoint of molecular design. An example thereof is a method of copolymerizing a monomer having a hydroxyl group to an acrylic polymer in advance and performing a condensation or addition reaction on the isocyanate compound having an isocyanate group that can react with this hydroxyl group and a radical reactive carbon-carbon double bond while maintaining the ultraviolet-ray curing property of the radical reactive carbon-carbon double bond.

In the internal type ultraviolet-ray curing-type pressure-sensitive adhesive, the base polymer (especially an acrylic polymer) having a radical reactive carbon-carbon double bond can be used alone. However, an ultraviolet-ray curable monomer component and an oligomer component may also be compounded at a level not deteriorating the characteristics.

The radiation-curing monomer component to be compounded includes, for example, urethane oligomer, urethane (meth)acrylate, trimethylol propane tri(meth)acrylate, tetramethylol methane tetra(meth)acrylate, pentaerythritol tri(meth)acrylate, pentaerythritol tetra(meth)acrylate, dipentaerythritol monohydroxy penta(meth)acrylate, dipentaerythritol hexa(meth)acrylate, 1,4-butane diol di(meth)acrylate, tetraethylene glycol di(meth)acrylate, 1,6-hexane diol (meth)acrylate, neopentyl glycol di(meth)acrylate etc.; ester acrylate oligomers; and isocyanurates or isocyanurate compounds such as 2-propenyl-3-butenyl cyanurate, tris(2-methacryloxyethyl) isocyanurate etc. The radiation-curing oligomer component includes various acrylate oligomers such as those based on urethane, polyether, polyester, polycarbonate, polybutadiene etc., and their molecular weight is preferably in the range of about 100 to 30000. For the compounded amount of the radiation-curable monomer component or oligomer component, the amount of which the adhesive strength of the pressure-sensitive adhesive layer can be decreased can be determined appropriately depending on the type of the above-described pressure-sensitive adhesive layer. In general, the compounded amount is, for example, 5 to 500 parts by weight relative to 100 parts by weight of the base polymer such as an acrylic polymer constituting the pressure-sensitive adhesive, and preferably about 40 to 150 parts by weight.

For curing with UV rays, a photopolymerization initiator preferably is incorporated into the radiation-curing pressure-sensitive adhesive. The photopolymerization initiator includes, for example, α-ketol compounds such as 4-(2-hydroxyethoxy)phenyl(2-hydroxy-2-propyl)ketone, α-hydroxy-α,α'-dimethyl acetophenone, 2-methyl-2-hydroxypropiophenone, 1-hydroxycyclohexyl phenyl ketone etc.; acetophenone compounds such as methoxyacetophenone, 2,2-dimethoxy-2-phenylacetophenone, 2,2-diethoxyacetophenone, 2-methyl-1-[4-(methylthio)-phenyl]-2-morpholinopropane-1 etc.; benzoin ether compounds such as benzoin ethyl ether, benzoin isopropyl ether, anisoin methyl ether etc.; ketal compounds such as benzyl dimethyl ketal etc.; aromatic sulfonyl chloride compounds such as 2-naphthalene sulfonyl chloride etc.; optically active oxime compounds such as 1-phenone-1,1-propanedione-2-(o-ethoxy-carbonyl)oxime etc.; benzophenone compounds such as benzophenone, benzoylbenzoic acid, 3,3'-dimethyl-4-methoxybenzophenone etc.; thioxanthone compounds such as thioxanthone, 2-chlorothioxanthone, 2-methyl thioxanthone, 2,4-dimethyl thioxanthone, isopropyl thioxanthone, 2,4-dichlorothioxanthone, 2,4-diethyl thioxanthone, 2,4-diisopropyl thioxanthone etc.; camphor quinone; halogenated ketone; acyl phosphinoxide; acyl phosphonate etc. The amount of the photopolymerization initiator to be incorporated is for example about 0.05 to 20 parts by weight, based on 100 parts by weight of the base polymer such as acrylic polymer etc. constituting the pressure-sensitive adhesive.

In the pressure-sensitive adhesive layer 2 of the dicing die-bonding film 10, a part of the pressure-sensitive adhesive layer 2 may be irradiated with the ultraviolet ray so that the adhesive strength of the portion 2a becomes smaller than the adhesive strength of another portion 2b. That is, the portion 2a can be formed where the adhesive strength is decreased by using the base 1 of which the entire or a part of the portion other than the portion corresponding to the semiconductor wafer pasting portion 3a on at least one side of the base 1 is shielded, forming the ultraviolet-ray curing-type pressure-sensitive adhesive layer 2 onto the base 1, and then curing the portion corresponding to the semiconductor wafer pasting portion 3a by ultraviolet ray irradiation. As the shielding material, a material that can be a photo mask on a support film can be manufactured by printing, vapor deposition, or the like.

When an impediment to curing due to oxygen occurs during the ultraviolet ray irradiation, it is desirable to shut off oxygen (air) from the surface of the ultraviolet-ray curing-type pressure-sensitive adhesive layer 2. Examples of the shut-off method include a method of coating the surface of the pressure-sensitive adhesive layer 2 with a separator and a method of performing irradiation with the ultraviolet ray in a nitrogen gas atmosphere.

The thickness of the pressure-sensitive adhesive layer 2 is not especially limited. However, it is preferably about 1 to 50 μm from the viewpoint of achieving both the prevention of the breakage of the chip cut face and the fixing and holding of the adhesive layer. The thickness is more preferably 2 to 30 μm, and further preferably 5 to 25 μm.

The die-bonding film 3 can be configured as only a single adhesive layer, for example. Further, the die-bonding film 3 may be of a multi-layer structure of two layers or more by appropriately combining thermoplastic resins having different glass transition temperatures and thermosetting resins having different thermosetting temperatures. Because cutting water is used in the dicing step of the semiconductor wafer, the die-bonding film 3 absorbs moisture, and there is a case that water is contained more than usual. When the die-bonding film 3 is adhered to the substrate or the like at such a high water content, water vapor accumulates on the adhesion interface at the after curing stage, and there is a case that floating occurs. Therefore, such a problem can be avoided by making the adhesive for adhering the die have a configuration in which a core material having high moisture permeability is sandwiched with the die adhesive and making the water vapor diffuse through the film at the after curing stage. From such a viewpoint, the die-bonding film 3 may have a multi-layer structure in which the adhesive layer is formed on one side or both sides of the core material.

The core material includes films such as a polyimide film, a polyester film, a polyethylene terephthalate film, a polyethylene naphthalate film, and a polycarbonate film, a glass fiber, a resin substrate reinforced with a plastic non-woven fiber, a silicon substrate, and a glass substrate.

The die-bonding film 3 according to the present invention is comprised by containing an epoxy resin as a main component. The epoxy resin is preferable from the viewpoint of containing fewer ionic impurities, etc. that corrode a semiconductor element. The epoxy resin is not particularly limited as long as it is generally used as an adhesive composition, and for example, a difunctional epoxy resin and a polyfunctional epoxy resin of such as a bisphenol A type, a bisphenol F type, a bisphenol S type, a brominated bisphenol A type, a hydrogenated bisphenol A type, a bisphenol AF type, a biphenyl type, a naphthalene type, a fluorine type, a phenol novolak type, an ortho-cresol novolak type, a trishydroxyphenyl-methane type, and a tetraphenylolethane type epoxy resin or an epoxy resin of such as a hydantoin type, a trisglycidylisocyanurate type and a glycidylamine type epoxy resin are used. These can be used alone or two or more types can be used in combination. Among these epoxy resins, a novolak type epoxy resin, a biphenyl type epoxy resin, a trishydroxyphenylmethane type resin, and a tetraphenylolethane type epoxy resin are particularly preferable. This is because these epoxy resins have high reactivity with a phenol resin as a curing agent, and are superior in heat resistance, etc.

Further, other thermosetting resins and thermoplastic resins can be used together in the die-bonding film 3 appropriately as necessary. Examples of the thermosetting resins include phenol resins, amino resins, unsaturated polyester resins, polyurethane resins, silicone resins, and thermosetting polyimide resins. These resins can be used alone or two types or more can be used together. Further, phenol resins are preferably used as a curing agent for the epoxy resin.

Furthermore, the phenol resins act as a curing agent for the epoxy resin, and examples thereof include novolak phenol resins such as a phenol novolak resin, a phenol aralkyl resin, a cresol novolak resin, a tert-butylphenol novolak resin, and a nonylphenol novolak resin, resol phenol resins, and polyoxystyrenes such as polyparaoxystyrene. These can be used alone or two types or more can be used together. Among these phenol resins, a phenol novolak resin and a phenol aralkyl resin are especially preferable because they can improve connection reliability of a semiconductor device.

The compounded ratio of the epoxy resin and the phenol resin is preferably arranged so that the amount of a hydroxyl group in the phenol resin in 1 equivalent of the epoxy group in the epoxy resin component becomes 0.5 to 2.0 equivalents. The amount is more preferably 0.8 to 1.2 equivalents. That is, when the compounded ratio of both resins becomes out of this range, sufficient curing reaction does not proceed, and the characteristics of the epoxy resin cured compound easily deteriorate.

Examples of the thermoplastic resin include a natural rubber, a butyl rubber, an isoprene rubber, a chloroprene rubber, an ethylene-vinyl acetate copolymer, an ethylene-acrylic acid copolymer, an ethylene-acrylic ester copolymer, a polybutadiene resin, a polycarbonate resin, a thermoplastic polyimide resin, polyamide resins such as 6-nylon and 6,6-nylon, a phenoxy resin, an acrylic resin, saturated polyester resins such as PET and PBT, a polyamideimide resin, and a fluorine resin. These thermoplastic resins can be used alone or two types are more can be used together. Among these thermoplastic resins, especially preferable is an acrylic resin containing a small amount of ionic impurities and having high heat resistance and in which reliability of the semiconductor element can be secured.

The acrylic resin is not especially limited, and examples thereof include a polymer containing one type or two types or more of esters of acrylic acid or methacrylic acid having a straight chain or branched alkyl group having 30 carbon atoms or less, especially 4 to 18 carbon atoms. Examples of the alkyl group include a methyl group, an ethyl group, a propyl group, an isopropyl group, an n-butyl group, a t-butyl group, an isobutyl group, an amyl group, an isoamyl group, a hexyl group, a heptyl group, a cyclohexyl group, a 2-ethylhexyl group, an octyl group, an isooctyl group, a nonyl group, an isononyl group, a decyl group, an isodecyl group, an undecyl group, a lauryl group, a tridecyl group, a tetradecyl group, a stearyl group, an octadecyl group, and a dodecyl group.

Other monomers that form the polymer are not especially limited, and examples thereof include carboxyl group-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl group-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxymethylcyclohexyl)-methylacrylate; sulfonic acid group-containing monomers such as styrenesulfonic acid, allylsulfonic acid, 2-(meth)acrylamide-2-methylpropanesulfonic acid, (meth)acrylamidepropanesulfonic acid, sulfopropyl (meth)acrylate, and (meth)acryloyloxynaphthalenesulfonic acid; and phosphoric acid group-containing monomers such as 2-hydroxyethylacryloyl phosphate.

Because the crosslinking is performed in the adhesive layer of the die-bonding film 3 to some extent in advance, a multifunctional compound that reacts with a functional group or the like of the molecular chain ends of the polymer is preferably added as a crosslinking agent upon manufacture. With this constitution, tackiness is improved under a high temperature and the heat resistance is improved.

Moreover, other additives can be appropriately compounded in the adhesive layer of the die-bonding film 3 as necessary. Examples of the other additives include a flame retardant, a silane coupling agent, and an ion trapping agent. Examples of the flame retardant include antimony trioxide, antimony pentoxide, and a brominated epoxy resin. These can be used alone or two types or more can be used together. Examples of the silane coupling agent include β-(3,4-epoxycyclohexyl)ethyltrimethoxysilane, γ-glycidoxypropyltrimethoxysilane, and γ-glycidoxypropylmethyldiethoxysilane. These compounds can be used alone or two types or more can be used together. Examples of the ion trapping agent include hydrotalcites and bismuth hydroxide. These can be used alone or two types or more can be used together.

The thickness of the die-bonding film 3 is not particularly limited. However, it is about 5 to 100 μm, and preferably about 5 to 50 μm.

The dicing die-bonding film 10, 11 can have an antistatic property. This prevents the generation of static electricity during its adhesion and peeling, and prevents a circuit from being damaged by charging of the workpiece such as a semiconductor wafer due to the static electricity. The antistatic property can be given by an appropriate method such as a method of adding an antistatic agent or a conductive material into the base 1, the pressure-sensitive adhesive layer 2, or the die-bonding film 3, and a method of attaching a conductive layer made of a charge transfer complex, a metal film or the like to the base 1. Among these methods, a method is preferable in which impurity ions that may change the quality of the semiconductor wafer are hardly generated. Examples of the conductive material (conductive filler) that is compounded to give electric conductivity, to improve thermal conductivity, and the like include sphere-shaped, needle-shaped, and flake-shaped metal powders of silver, aluminum, gold, copper, nickel, conductive alloys or the like, metal oxides of alumina or the like, amorphous carbon black, and graphite. However, the die-bonding film 3, 3' is preferably non-conductive from the viewpoint that the film can be made not to cause electric leakage.

The die-bonding film 3, 3' of the dicing die-bonding film 10, 11 is preferably protected by a separator (not shown in the drawings). The separator has a function as a protective material to protect the die-bonding film 3, 3' until the film is put to practical use. Further, the separator can be used also as a support base when the die-bonding film 3, 3' is transferred to the pressure-sensitive adhesive layer 2. The separator is peeled off when the workpiece is pasted onto the die-bonding film 3, 3' of the dicing die-bonding film. Polyethylene terephthalate (PET), polyethylene, polyprolylene, a plastic film whose surface is coated with a peeling agent such as a fluorine peeling agent or a long-chain alkylacrylate peeling agent, paper, and the like can also be used as the separator.

(Method of Manufacturing Dicing Die-Bonding Film)

Next, a method of manufacturing the dicing die-bonding film of the present invention is explained using the dicing die-bonding film 10 as an example. First, the base 1 can be formed by a conventionally known film formation method. Examples of the film formation method include a calender film formation method, a casting method in an organic solvent, an inflation extrusion method in a sealed system, a T-die extrusion method, a co-extrusion method, and a dry lamination method.

Next, a pressure-sensitive adhesive layer precursor is formed by forming a coating film by applying a pressure-sensitive adhesive composition onto the base 1 and then by drying (by heat-drying as necessary) the coating film under a prescribed condition. The application method is not especially limited, and examples thereof include roll coating, screen coating, and gravure coating. The drying condition can be set variously depending on the thickness, the material, and the like of the coating film. Specifically, it is performed in a range of a drying temperature of 80 to 150° C. and a drying time of 0.5 to 5 minutes, for example. The pressure-sensitive adhesive layer precursor may be formed by forming a coating film by applying a pressure-sensitive adhesive composition onto a separator and then by drying the coating film with the above-described condition. After that, the pressure-sensitive adhesive layer precursor is transferred onto the base 1. The pressure-sensitive adhesive layer precursor formed in such manner is irradiated with the ultraviolet ray, and thus the pressure-sensitive adhesive layer 2 is formed. As the irradiation condition of the ultraviolet ray, the cumulative radiation is preferably in a range of 30 to 1000 mJ/cm$^2$, and more preferably in a range of 100 to 500 mJ/cm$^2$. When the irradiation with the ultraviolet ray is less than 30 mJ/cm$^2$, there is a case that curing of the pressure-sensitive adhesive layer becomes insufficient. As a result, the adhesion with the die-bonding film increases, and this causes a deterioration of the pickup property. Further, adhesive residue is generated in the die-bonding film after picking up. On the other hand, when the irradiation of the ultraviolet ray exceeds 1000 mJ/cm$^2$, there is a case that the base is thermally damaged. Further, the tensile modulus becomes too high by excessive curing of the pressure-sensitive adhesive layer and deterioration of the expansion property. The adhesive strength becomes too low, and thus there is a case that chip fly occurs upon dicing the semiconductor wafer.

Next, the coating layer is formed by applying a forming material to form the die-bonding film 3 onto the release paper to a prescribed thickness and drying the material under a prescribed condition. The die-bonding film 3 is formed by transferring this coating layer onto the pressure-sensitive adhesive layer 2. Further, the die-bonding film 3 can also be formed by directly applying the forming material onto the pressure sensitive adhesive layer 2 and then drying the material under a prescribed condition. With this operation, the dicing die-bonding film 10 of the present invention can be obtained.

(Method of Manufacturing Semiconductor Device)

The method of manufacturing a semiconductor device using the dicing die bond film 11 of the present invention is explained by referring to FIG. 3.

First, a semiconductor wafer 4 is fixed onto the die-bonding film 3' in the dicing die-bonding film 11 by press-bonding and by adhering and holding (mounting step). The present step is performed while pressing with a pressing means such as a press-bonding roll.

Next, dicing of the semiconductor wafer 4 is performed. With this operation, a semiconductor chip 5 is formed by cutting the semiconductor wafer 4 into a prescribed size to make it into individual pieces. The dicing is performed following an ordinary method from the circuit face side of the semiconductor wafer 4, for example. Further, a cutting method, so-called full cut, in which cutting-in is performed to the dicing die-bonding film 10, can be adopted in the present step, for example. The dicing apparatus that is used in the present step is not especially limited, and a conventionally known apparatus can be used. Further, because the semiconductor wafer is adhered and fixed by the dicing die-bonding film 10, chip breakage and chip fly can be suppressed, and at the same time, damage of the semiconductor wafer 4 can be suppressed. Even when cutting-in is performed to the pressure-sensitive adhesive layer 2 by dicing, the generation of scraps and the like can be prevented because the pressure-sensitive adhesive layer 2 is cured by the ultraviolet ray irradiation.

Next, expansion of the dicing die bond film 11 is performed. The expansion is performed using a conventionally known expanding apparatus. The expanding apparatus has a donut-shaped outer ring that can push the dicing die bond film 11 downwards through the dicing ring and an inner ring having a smaller diameter than the outer ring and supporting the dicing die bond film 11. Because only the portion 2a in the pressure-sensitive adhesive layer 2 is cured by the ultraviolet ray irradiation and the other portion 2b is not cured in the dicing die bond film 11, the space between the adjacent semiconductor chips can be sufficiently broadened without breaking. As a result, damage to the semiconductor chip by the semiconductor chips contacting to each other upon picking up, which is described later, can be prevented.

Picking up of the semiconductor chip 5 is performed to peel off the semiconductor chip that is adhered and fixed to the dicing die-bonding film 10. The method of picking up is not especially limited, and various conventionally known methods can be adopted. Examples thereof include a method of pushing up an individual semiconductor chip 5 from the dicing die-bonding film 10 side using a needle and picking up the semiconductor chip 5 that is pushed up with a picking up apparatus. Because the peeling property of the pressure-sensitive adhesive layer 2 and the die bond film 3 is good in the dicing die bond film 10, the pickup can be performed by reducing the number of needles and by increasing the yield even when the pushing up amount is small.

The semiconductor chip 5 that is picked up is adhered and fixed to an adherend 6 interposing the die-bonding film 3a therebetween (die bonding). The adherend 6 is loaded on a heat block 9. Examples of the adherend 6 include a lead frame, a TAB film, a substrate, and a semiconductor chip that is separately produced. The adherend 6 may be a deformable adherend that can be deformed easily or may be a non-deformable adherend such as a semiconductor wafer that is difficult to be deformed.

As the substrate, a conventionally known one can be used. Further, metal lead frames such as a Cu lead frame and a 42 Alloy lead frame and an organic substrate made of glass epoxy, BT (Bismaleimide-Triazine), polyimide, and the like can be used as the lead frame. However, the present invention is not limited to the above-described ones, and a circuit substrate is also included in which a semiconductor element is mounted and that can be used by being electrically connected with the semiconductor element.

When the die-bonding film 3 is of a thermosetting type, the heat resistant strength is improved by adhering and fixing the semiconductor chip 5 to the adherend 6 by heat-curing. The substrate or the like to which the semiconductor chip 5 is adhered and fixed interposing the semiconductor wafer pasting portion 3a therebetween can be subjected to a reflow step. After that, wire bonding is performed to electrically connect the tip of the terminals (inner lead) of the substrate and an electrode pad (not shown in the drawings) on the semiconductor chip 5 with a bonding wire 7, the semiconductor chip is sealed with a sealing resin 8, and the sealing resin 8 is after-cured. With this operation, the semiconductor device of the present embodiment is produced.

Below, preferred examples of the present invention are explained in detail. However, materials, addition amounts, and the like described in these examples are not intended to limit the scope of the present invention, and are only examples for explanation as long as there is no description of limitation in particular. In the examples, the word "part(s)" represent "part(s) by weight", respectively, unless otherwise specified.

EXAMPLE 1

<Production of Dicing Film>

Acrylic polymer A having a weight average molecular weight of 580,000 was obtained by placing 51.7 parts of 2-ethylhexyl acrylate (hereinafter referred to as "2EHA"), 39.0 parts of stearyl acrylate (hereinafter referred to as "SA"), 9.3 parts of 2-hydroxyethyl acrylate (below, referred to as "HEA"), 0.2 parts of benzoyl peroxide, and 65 parts of toluene into a reactor equipped with a cooling tube, a nitrogen-introducing tube, a thermometer, and a stirring apparatus, and performing a polymerization treatment at 61° C. in a nitrogen airflow for 6 hours. The weight average molecular weight is as follows. The molar ratio of 2EHA to SA to HEA was made to be 70 mol:30 mol:20 mol.

An acrylic polymer A' was obtained by adding 10.0 parts (80 mol % to HEA) of 2-methacryloyloxyethyl isocyanate (in the following, referred to as "MOI") into this acrylic polymer A and performing an addition reaction treatment at 50° C. in an air flow for 48 hours.

Next, a pressure-sensitive adhesive solution was produced by adding 30 parts of KAYARD DPHA (trade name, manufactured by Nippon Kayaku Co., Ltd.), 8 parts of a polyisocyanate compound (trade name "CORONATE L" manufactured by Nippon Polyurethane Industry Co., Ltd.), and 5 parts of a photopolymerization initiator (trade name "IRGACURE 651" manufactured by Chiba Specialty Chemicals) into 100 parts of the acrylic polymer A'

A pressure-sensitive adhesive layer precursor having a thickness of 10 μm was formed by applying the prepared pressure-sensitive adhesive solution onto the surface of a PET peeling liner where a silicone treatment was performed and heat-crosslinking the product at 120° C. for 2 minutes. Next, a polyolefin film having a thickness of 100 μm was pasted onto the corresponding surface of the pressure-sensitive adhesive layer precursor. After that, the product was kept at 50° C. for 24 hours, and then a pressure-sensitive adhesive layer was formed by irradiating only a portion (220 mm diameter) corresponding to the semiconductor wafer pasting portion (200 mm diameter) of the pressure-sensitive adhesive layer precursor with an ultraviolet ray. The dicing film according to the present example was thus produced. The irradiation condition of the ultraviolet ray was as follows.

<Irradiation Conditions of the Ultraviolet Ray>

Ultraviolet ray (UV) irradiation apparatus: high pressure mercury lamp

Ultraviolet ray cumulative radiation: 500 mJ/cm$^2$

Output: 75 W

Irradiation strength: 150 mW/cm$^2$

The ultraviolet ray was radiated directly onto the pressure-sensitive adhesive layer precursor.

<Production of Die-Bonding Film>

59 parts of an epoxy resin 1 (trade name "EPICOAT 1004" manufactured by Japan Epoxy Resins Co., Ltd.), 53 parts of an epoxy resin 2 (trade name "EPICOAT 827 manufactured by Japan Epoxy Resins Co., Ltd.), 121 parts of a phenol resin (trade name "MILEX XLC-4L" manufactured by Mitsui Chemicals, Inc.), and 222 parts of spherical silica (trade name "SO-25R" manufactured by Admatechs) to 100 parts of an acrylic ester polymer (trade name "PARACRON W-197CM" manufactured by Negami Chemical Industrial Co., Ltd.) containing ethyl acrylate-methyl methacrylate as a main component were dissolved into methylethylketone, and the mixture was prepared so that the concentration became 23.6% by weight.

This solution of the pressure-sensitive adhesive composition was applied onto a release treatment film made of a polyethylene terephthalate film having a thickness of 38 μm on which a silicone release treatment was performed as a peeling liner (separator), and then dried at 130° C. for 2 minutes. With this operation, a die-bonding film having a thickness of 25 μm was produced. Furthermore, the dicing die-bonding film of the present example was obtained by transferring the die-bonding film to the pressure-sensitive adhesive layer side in the dicing film.

<Measurement of Weight Average Molecular Weight Mw>

The measurement of the weight average molecular weight Mw was performed by GPC (Gel Permeation Chromatography). The measurement condition is as follows. The weight average molecular weight was calculated by polystyrene conversion.

Measurement apparatus: HLC-8120GPC (trade name) manufactured by Tosoh Corporation Column: TSKgel GMH-H(S)×2 (product number) manufactured by Tosoh Corporation
Flow rate: 0.5 ml/min
Amount injected: 100 μl
Column temperature: 40° C.
Eluent: THF
Concentration of injected sample: 0.1° by weight
Detector: differential refractometer EXAMPLES 2 to 13

In each of Examples 2 to 13, the dicing die-bonding film was produced in the same manner as in Example 1 except that the composition and the compounded ratio were changed to those shown in Table 1.

TABLE 1

| | ACRYLIC ESTER A | | ACRYLIC ESTER B | | | HYDROXYL GROUP-CONTAINING MONOMER | | ISOCYANATE COMPOUND | | | | PHOTOPOLYMERIZATION |
|---|---|---|---|---|---|---|---|---|---|---|---|---|
| | 2EHA | i-OA | SA | VA | BA | HEA | 4HBA | MOI | AOI | TOLUENE | C/L | INITIATOR |
| EXAMPLE 1 | 51.7 (70) | — | 39.0 (30) | — | — | 9.3 (20) | — | 10.0 (80) | — | 65 | 8 | 5 |
| EXAMPLE 2 | 53.7 (70) | — | 40.5 (30) | — | — | 5.8 (12) | — | 6.4 (83) | — | 65 | 8 | 5 |
| EXAMPLE 3 | 49.4 (70) | — | 37.3 (30) | — | — | 13.3 (30) | — | 14.3 (80) | — | 65 | 8 | 5 |
| EXAMPLE 4 | 68.5 (85) | — | 44.3 (35) | — | — | 10.2 (20) | — | 10.9 (80) | — | 65 | 8 | 5 |
| EXAMPLE 5 | 46.7 (65) | — | 39.0 (30) | — | — | 9.1 (20) | — | 9.7 (80) | — | 65 | 8 | 5 |
| EXAMPLE 6 | — | 51.7 (70) | 38.2 (30) | — | — | 9.3 (20) | — | 10.0 (80) | — | 65 | 8 | 5 |
| EXAMPLE 7 | 50.6 (70) | — | 38.2 (30) | — | — | — | 11.3 (20) | 9.7 (80) | — | 65 | 8 | 5 |
| EXAMPLE 8 | 51.7 (70) | — | 39.0 (30) | — | — | 9.3 (20) | — | — | 9.1 (80) | 65 | 8 | 5 |
| EXAMPLE 9 | 51.7 (70) | — | 39.0 (30) | — | — | 9.3 (20) | — | 8.7 (70) | — | 65 | 8 | 5 |
| EXAMPLE 10 | 51.7 (70) | — | 39.0 (30) | — | — | 9.3 (20) | — | 11.2 (90) | — | 65 | 8 | 5 |
| EXAMPLE 11 | 51.7 (70) | — | 39.0 (30) | — | — | 9.3 (20) | — | 10.0 (80) | — | 100 | 8 | 5 |
| EXAMPLE 12 | 51.7 (70) | — | 39.0 (30) | — | — | 9.3 (20) | — | 10.0 (80) | — | 40 | 8 | 5 |
| EXAMPLE 13 | 59.7 (80) | — | — | 30.8 (20) | — | 9.4 (20) | — | 10.0 (80) | — | 65 | — | 5 |

The values in parentheses represent mol %. However, the values in parentheses in HEA and 4HBA represent mol % with respect to 100 mol % of the total amount of the acrylic ester. Further, the values in parentheses in MOI and AOI represent mol % to the hydroxyl group-containing monomer.

The meaning of the abbreviations described in Table 1 and the following Table 2 is as follows.

2EHA: 2-ethylhexyl acrylate
i-OA: isooctyl acrylate
SA: stearyl acrylate
VA: behenyl acrylate
BA: n-butyl acrylate
HEA: 2-hydroxyethyl acrylate
4HBA: 4-hydroxybutyl acrylate
AOI: 2-acryloyloxyethyl isocyanate
C/L: polyisocyanate compound (trade name "CORONATE L" manufactured by Nippon Polyurethane Industry Co., Ltd.)

COMPARATIVE EXAMPLES 1 to 8

In each of Comparative Examples 1 to 7, the dicing die-bonding film was produced in the same manner as in Example 1 except that the composition and the compounded ratio were changed to those shown in Table 2. In Comparative Example 8, the dicing die bond film was produced in the same manner as in Example 1 except that the composition and the compounded ratio were changed to those shown in Table 2 and the ultraviolet ray irradiation before pasting the die bond film was not performed.

The wafer grinding condition, the laminating condition, and the dicing condition are described later.

<Wafer Grinding Condition>
Grinding apparatus: DFG-8560 manufactured by DISCO Corporation
Semiconductor wafer: 8 inch in diameter (the backside was polished to a thickness of 0.6 mm to 0.15 mm.)

<Pasting Conditions>
Pasting apparatus: MA-3000II manufactured by Nitto Seki Co., Ltd.
Pasting speed: 10 mm/min
Pasting pressure: 0.15 MPa
Stage temperature during pasting: 40° C.

<Dicing Conditions>
Dicing apparatus: DFD-6361 manufactured by DISCO Corporation
Dicing ring: 2-8-1 manufactured by DISCO Corporation
Dicing speed: 80 mm/sec
Dicing blade:
Z1: 2050HEDD manufactured by DISCO Corporation
Z2: 2050HEBB manufactured by DISCO Corporation
Dicing blade rotational speed:
Z1: 40,000 rpm
Z2: 40,000 rpm

TABLE 2

| | ACRYLIC ESTER A | | ACRYLIC ESTER B | | | HYDROXYL GROUP-CONTAINING MONOMER | | ISOCYANATE COMPOUND | | | | PHOTO-POLYMERIZATION |
|---|---|---|---|---|---|---|---|---|---|---|---|---|
| | 2EHA | i-OA | SA | VA | BA | HEA | 4HBA | MOI | AOI | TOLUENE | C/L | INITIATOR |
| COMPARATIVE EXAMPLE 1 | — | — | 34.0 (20) | — | 53.8 (80) | 12.2 (20) | — | 13.0 (80) | — | 65 | 8 | 5 |
| COMPARATIVE EXAMPLE 2 | 56.4 (70) | — | 42.6 (30) | — | — | 1.0 (2) | — | 1.1 (80) | — | 65 | 8 | 5 |
| COMPARATIVE EXAMPLE 3 | 45.4 (70) | — | 34.2 (30) | — | — | 20.4 (50) | — | 21.8 (80) | — | 65 | 8 | 5 |
| COMPARATIVE EXAMPLE 4 | 51.7 (70) | — | 39.0 (30) | — | — | 9.3 (20) | — | 6.2 (50) | — | 65 | 8 | 5 |
| COMPARATIVE EXAMPLE 5 | 81.6 (95) | — | 7.6 (5) | — | — | 10.8 (20) | — | 11.6 (80) | — | 65 | 8 | 5 |
| COMPARATIVE EXAMPLE 6 | 25.3 (40) | — | 66.8 (60) | — | — | 8.0 (20) | — | 8.5 (80) | — | 65 | 8 | 5 |
| COMPARATIVE EXAMPLE 7 | 51.7 (70) | — | 39.0 (30) | — | — | 9.3 (20) | — | 12.4 (100) | — | 65 | 8 | 5 |
| COMPARATIVE EXAMPLE 8 | 51.7 (70) | — | 39.0 (30) | — | — | 9.3 (20) | — | 10.0 (80) | — | 65 | 8 | 5 |

The values in parentheses represent mol %. However, the values in parentheses in HEA and 4HBA represent mol % with respect to 100 mol % of the total amount of the acrylic ester. Further, the values in parentheses in MOI and AOI represent mol % to the hydroxyl group-containing monomer.

(Dicing)

Dicing of the semiconductor was actually performed in the following manner using each of the dicing die-bonding films of the Examples and Comparative Examples, and performance of each dicing die-bonding film was evaluated.

A backside polishing treatment was performed on a semiconductor wafer (8 inch diameter and 0.6 mm thick), and a mirror wafer having a thickness of 0.15 mm was used as a workpiece. The separator was peeled off from the dicing die-bonding film, the mirror wafer was laminated onto the die-bonding film by roll press-bonding at 40° C., and the dicing was performed. Further, the dicing was performed to full-cut so that the chips had a size of 1 mm square. Whether there was chip fly or not was confirmed on the semiconductor wafer and on the dicing die-bonding film after cutting. The chip fly was evaluated in the following manner: the case where even one semiconductor chip flew is marked as x, and the case where no semiconductor chip flew is marked as ○.

Blade height:
Z1: 0.215 mm (depending on the thickness of the semiconductor wafer (When the wafer thickness is 75 μm, it is 0.170 mm.))
Z2: 0.085 mm
Cutting method: A mode/Step cut
Wafer chip size: 1.0 mm square (Picking Up)

The picking up was actually performed after the dicing of the semiconductor wafer was performed in the following manner using each of the dicing die-bonding films of the Examples and Comparative Examples, and performance of each dicing die-bonding film was evaluated.

A backside polishing treatment was performed on a semiconductor wafer (8 inch diameter and 0.6 mm thick), and a mirror wafer having a thickness of 0.050 mm was used as a workpiece. The separator was peeled off from the dicing die-bonding film, the mirror wafer was laminated onto the die-bonding film by roll press-bonding at 40° C., and dicing was performed. The dicing was performed to full-cut so that the chips had a size of 10 mm square.

Next, the expansion step was performed by stretching each dicing die-bonding film to make the space between chips a prescribed interval. However, the expansion step was performed on the dicing die-bonding film of Comparative Example 8 after performing the ultraviolet ray irradiation. As the irradiation condition of the ultraviolet ray, UM-810 (trade name, manufactured by Nitto Seiki Co., Ltd.) was used as the ultraviolet ray (UV) irradiation apparatus and the cumulative radiation of the ultraviolet ray was made to be 300 mJ/cm$^2$. The ultraviolet ray irradiation was performed from the polyolefin film side.

Evaluation of the pickup property was performed by picking up the semiconductor chip with a method of pushing up the semiconductor chip by a needle from the base side of each dicing die-bonding film. Specifically, 400 semiconductor chips were continuously picked up, and the successful rate was shown when the picking up was performed in the following condition.

<Wafer Grinding Condition>

Grinding apparatus: DFG-8560 manufactured by DISCO Corporation

Semiconductor wafer: 8 inch in diameter (the backside was polished to a thickness of 0.6 mm to 0.050 mm.)

<Pasting Conditions>

Pasting apparatus: MA-3000II manufactured by Nitto Seki Co., Ltd.

Pasting speed: 10 mm/min

Pasting pressure: 0.15 MPa

Stage temperature during pasting: 40° C.

<Dicing Conditions>

Dicing apparatus: DFD-6361 manufactured by DISCO Corporation

Dicing ring: 2-8-1 manufactured by DISCO Corporation

Dicing speed: 80 mm/sec

Dicing blade:

Z1: 2050HEDD manufactured by DISCO Corporation

Z2: 2050HEBB manufactured by DISCO Corporation

Dicing blade rotational speed:

Z1: 40,000 rpm

Z2: 40,000 rpm

Blade height:

Z1: 0.170 mm (depending on the thickness of the semiconductor wafer (When the wafer thickness is 50 μm, it is 0.170 mm.))

Z2: 0.085 mm

Cutting method: A mode/Step cut

Wafer chip size: 10.0 mm square

<Picking Up Condition>

The picking up was performed in each of the conditions shown in the following Table 3.

TABLE 3

| NEEDLE | TOTAL LENGTH 10 mm, DIAMETER 0.7 mm, SHARP ANGLE 15 degrees, TIP R 350 μm |
|---|---|
| NUMBER OF NEEDLES | 9 |
| NEEDLE PUSHING UP AMOUNT (μm) | 200 |
| NEEDLE PUSHING UP SPEED (mm/sec) | 5 |
| COLLET MAINTAINING TIME (msec) | 200 |
| EXPANDING SPEED (mm/sec) | 3 |

(Method of Measuring Tensile Modulus)

As the measurement conditions, the sample size was made to be an initial length of 10 mm and a sectional area of 0.1 to 0.5 mm$^2$, the measurement temperature was made to be 23° C., the distance to the chuck was made to be 50 mm, and the tensile test was performed in the MD direction or the TD direction at a tensile speed of 50 mm/min, and the variation in elongation (mm) of the sample in each direction was measured. As a result, the tensile modulus was obtained by drawing a tangent line at the initial rising part of the obtained S-S curve and dividing the tensile strength when the tangent line corresponds to 100% elongation by the sectional area of the base film. Measurement of the tensile modulus after the ultraviolet ray irradiation was performed after the sample was irradiated with an ultraviolet ray from the polyolefin film side under the above-described irradiation conditions.

(Peeling Adhesive Strength)

A sample piece having a width of 10 mm was cut out from each dicing die-bonding film, and was pasted onto a silicon mirror wafer placed on a hot plate at 40° C. After the sample piece was left for about 30 minutes, the sample was irradiated with the ultraviolet ray from the dicing film side, and the peeling adhesive strength was measured using a tensile test machine. The measurement conditions were a peeling angle of 15° and a tensile speed of 300 mm/min. Conservation and measurement of the peeling adhesive strength of the sample piece were performed under an environment of a temperature of 23° C. and a relative humidity of 50%. However, the ultraviolet irradiation was performed on the dicing die-bonding film of Comparative Examples 8 from the dicing film side after laminating the dicing die-bonding film to a silicon mirror wafer in the same condition as described above and leaving it for about 30 minutes. The irradiation condition of the ultraviolet ray was as follows. After the irradiation, measurement of the peeling adhesive strength was performed in the same condition as described above.

<Irradiation Conditions of the Ultraviolet Ray>

Ultraviolet ray (UV) irradiation apparatus: high pressure mercury lamp

Ultraviolet ray cumulative radiation: 500 mJ/cm$^2$

Output: 75 W

Irradiation strength: 150 mW/cm$^2$

TABLE 4

| | Mw (ten thousands) | UV IRRADIATION | TENSILE STORAGE MODULUS AFTER UV CURING (MPa) | PEELING ADHESIVE STRENGTH (N/10 mm) | PICK UP (%) | CHIP FLY |
|---|---|---|---|---|---|---|
| EXAMPLE 1 | 54 | IRRADIATION BEFORE LAMINATING DIE-BONDING FILM | 16.1 | 0.72 | 100.0 | ○ |
| EXAMPLE 2 | 50 | IRRADIATION BEFORE LAMINATING DIE-BONDING FILM | 10.3 | 0.87 | 100.0 | ○ |
| EXAMPLE 3 | 60 | IRRADIATION BEFORE LAMINATING DIE-BONDING FILM | 70.9 | 0.74 | 100.0 | ○ |
| EXAMPLE 4 | 58 | IRRADIATION BEFORE LAMINATING DIE-BONDING FILM | 18.4 | 0.87 | 100.0 | ○ |
| EXAMPLE 5 | 53 | IRRADIATION BEFORE LAMINATING DIE-BONDING FILM | 19.4 | 0.68 | 100.0 | ○ |
| EXAMPLE 6 | 54 | IRRADIATION BEFORE LAMINATING DIE-BONDING FILM | 16.2 | 0.71 | 100.0 | ○ |
| EXAMPLE 7 | 53 | IRRADIATION BEFORE LAMINATING DIE-BONDING FILM | 17.2 | 0.70 | 100.0 | ○ |
| EXAMPLE 8 | 54 | IRRADIATION BEFORE LAMINATING DIE-BONDING FILM | 16.0 | 0.72 | 99.8 | ○ |
| EXAMPLE 9 | 54 | IRRADIATION BEFORE LAMINATING DIE-BONDING FILM | 12.3 | 0.77 | 100.0 | ○ |
| EXAMPLE 10 | 54 | IRRADIATION BEFORE LAMINATING DIE-BONDING FILM | 20.7 | 0.70 | 100.0 | ○ |
| EXAMPLE 11 | 40 | IRRADIATION BEFORE LAMINATING DIE-BONDING FILM | 15.8 | 0.74 | 100.0 | ○ |
| EXAMPLE 12 | 85 | IRRADIATION BEFORE LAMINATING DIE-BONDING FILM | 16.8 | 0.73 | 100.0 | ○ |
| EXAMPLE 13 | 55 | IRRADIATION BEFORE LAMINATING DIE-BONDING FILM | 15.8 | 0.72 | 100.0 | ○ |

TABLE 5

| | Mw (ten thousands) | UV IRRADIATION | TENSILE STORAGE MODULUS AFTER UV CURING (MPa) | PEELING ADHESIVE STRENGTH (N/10 mm) | PICK UP (%) | CHIP FLY |
|---|---|---|---|---|---|---|
| COMPARATIVE EXAMPLE 1 | 76 | IRRADIATION BEFORE LAMINATING DIE-BONDING FILM | 78.4 | 0.95 | 0.0 | ○ |
| COMPARATIVE EXAMPLE 2 | 52 | IRRADIATION BEFORE LAMINATING DIE-BONDING FILM | 6.7 | 1.10 | 35.3 | ○ |
| COMPARATIVE EXAMPLE 3 | 59 | IRRADIATION BEFORE LAMINATING DIE-BONDING FILM | 115 | 0.90 | 42.7 | ○ |
| COMPARATIVE EXAMPLE 4 | 54 | IRRADIATION BEFORE LAMINATING DIE-BONDING FILM | 10.5 | 1.15 | 0.0 | ○ |
| COMPARATIVE EXAMPLE 5 | 57 | IRRADIATION BEFORE LAMINATING DIE-BONDING FILM | 17.1 | 0.98 | 7.8 | ○ |

TABLE 5-continued

| | Mw (ten thousands) | UV IRRADIATION | TENSILE STORAGE MODULUS AFTER UV CURING (MPa) | PEELING ADHESIVE STRENGTH (N/10 mm) | PICK UP (%) | CHIP FLY |
|---|---|---|---|---|---|---|
| COMPARATIVE EXAMPLE 6 | 52 | IRRADIATION BEFORE LAMINATING DIE-BONDING FILM | 17.4 | 0.48 | 100.0 | X |
| COMPARATIVE EXAMPLE 7 | 54 | IRRADIATION BEFORE LAMINATING DIE-BONDING FILM | 23.1 | 1.91 | 40.5 | ◯ |
| COMPARATIVE EXAMPLE 8 | 54 | IRRADIATION AFTER DICING | 16.1 | 1.13 | 45.0 | ◯ |

What is claimed is:

1. A dicing die-bonding film having a dicing film having a pressure-sensitive adhesive layer on a base and a die-bonding film provided on the pressure-sensitive adhesive layer, wherein
the pressure-sensitive adhesive layer is formed from an acrylic polymer comprising acrylic ester A represented by $CH_2$=$CHCOOR^1$ (wherein $R^1$ is an alkyl group having 6 to 10 carbon atoms), acrylic ester B represented by $CH_2$=$CHCOOR^2$ (wherein $R^2$ is an alkyl group having 11 carbon atoms or more), a hydroxyl group-containing monomer, and an isocyanate compound having a radical reactive carbon-carbon double bond within a molecular,
the compounded ratio of the acrylic ester A and the acrylic ester B is 40 to 10 mol % of the acrylic ester B with respect to 60 to 90 mol % of the acrylic ester A,
the compounded ratio of the hydroxyl group-containing monomer is in the range of 10 to 30 mol % with respect to 100 mol % of the total of the acrylic ester A and the acrylic ester B,
the compounded ratio of the isocyanate compound is in the range of 70 to 90 mol % with respect to 100 mol % of the hydroxyl group-containing monomer,
the pressure-sensitive adhesive layer is cured by ultraviolet ray irradiation, and
the die-bonding film is formed from an epoxy resin and is laminated on the pressure-sensitive adhesive layer after the ultraviolet ray irradiation.

2. The dicing die-bonding film according to claim 1, wherein the cumulative radiation of the ultraviolet ray irradiation is in a range of 30 to 1000 mJ/cm².

3. The dicing die-bonding film according to claim 1, wherein the hydroxyl group-containing monomer is at least any one selected from the group consisting of 2-hydroxyethyl (meth)acrylate, 2-hydroxypropyl (meth)acrylate, 4-hydroxybutyl (meth)acrylate, 6-hydroxyhexyl (meth)acrylate, 8-hydrorxyoctyl (meth)acrylate, 10-hydroxydecyl (meth)acrylate, 12-hydroxylauryl (meth)acrylate, and (4-hydroxymethylcyclohexyl)methyl (meth)acrylate.

4. The dicing die-bonding film according to claim 1, wherein the isocyanate compound having a radical reactive carbon-carbon double bond is at least 2-methacryloyloxyethyl isocyanate or 2-acrylolyloxyethyl isocyanate.

5. The dicing die-bonding film according to claim 1, wherein the weight average molecular weight of the acrylic polymer is in a range of 350,000 to 1,000,000.

6. The dicing die-bonding film according to claim 1, wherein the tensile modulus at 23° C. of the pressure-sensitive adhesive layer after ultraviolet ray irradiation is in the range of 7 to 170 MPa.

7. The dicing die-bonding film according to claim 1, wherein the acrylic polymer comprising the pressure-sensitive adhesive layer does not contain an acrylic acid as a monomer component.

8. A method for manufacturing a dicing die-bonding film having a dicing film having a pressure-sensitive adhesive layer on a base and a die-bonding film provided on the pressure-sensitive adhesive layer, comprising
a step of forming a pressure-sensitive adhesive layer precursor on the base, wherein the precursor is formed from an acrylic polymer comprising acrylic ester A represented by $CH_2$=$CHCOOR^1$ (wherein $R^1$ is an alkyl group having 6 to 10 carbon atoms), acrylic ester B represented by $CH_2$=$CHCOOR^2$ (wherein $R^2$ is an alkyl group having 11 carbon atoms or more), and a hydroxyl group-containing monomer on the base and wherein
the compounded ratio of the acrylic ester A and the acrylic ester B is 40 to 10 mol % of the acrylic ester B with respect to 60 to 90 mol % of the acrylic ester A,
the compounded ratio of the hydroxyl group-containing monomer is in the range of 10 to 30 mol % with respect to 100 mol % of the total of the acrylic ester A and the acrylic ester B, and
the compounded ratio of isocyanate compound is in the range of 70 to 90 mol % with respect to 100 mol % of the monomer containing a hydroxyl group, and comprising
a step of forming the pressure-sensitive adhesive layer by irradiating the pressure-sensitive adhesive layer precursor with an ultraviolet ray, and
a step of laminating the die-bonding film onto the pressure-sensitive adhesive layer.

9. The method of manufacturing a dicing die-bonding film according to claim 8, wherein the irradiation with the ultraviolet ray is performed in a range of 30 to 1000 mJ/cm².

10. A method of manufacturing a semiconductor device using a dicing die-bonding film comprising a dicing film having a pressure-sensitive adhesive layer on a base and a die-bonding film provided on the pressure-sensitive adhesive layer, wherein a dicing die-bonding film is prepared, and comprising
a step of press-pasting a semiconductor wafer onto the die-bonding film,
a step of forming a semiconductor chip by dicing the semiconductor wafer together with the die-bonding film, and
a step of peeling the semiconductor chip together with the die-bonding film off the pressure-sensitive adhesive layer, and wherein
the pressure-sensitive adhesive layer is not irradiated with the ultraviolet ray from the step of press-pasting the semiconductor wafer to the step of peeling off the semiconductor chip, and wherein the pressure-sensitive adhesive layer is formed from an acrylic polymer comprising acrylic ester A represented by $CH_2\!\!=\!\!CHCOOR^1$ (wherein $R^1$ is an alkyl group having 6 to 10 carbon atoms), acrylic ester B represented by $CH_2\!\!=\!\!CHCOOR^2$ (wherein $R^2$ is an alkyl group having 11 carbon atoms or more), a hydroxyl group-containing monomer, and an isocyanate compound having a radical reactive carbon-carbon double bond within a molecular, the compounded ratio of the acrylic ester A and the acrylic ester B is 40 to 10 mol % of the acrylic ester B with respect to 60 to 90 mol % of the acrylic ester A, the compounded ratio of the hydroxyl group-containing monomer is in the range of 10 to 30 mol % with respect to 100 mol % of the total of the acrylic ester A and the acrylic ester B, the compounded ratio of the isocyanate compound is in the range of 70 to 90 mol % with respect to 100 mol % of the hydroxyl group-containing monomer, the pressure-sensitive adhesive layer is cured by ultraviolet ray irradiation, and the die-bonding film is formed from an epoxy resin and is laminated on the pressure-sensitive adhesive layer after the ultraviolet ray irradiation.

* * * * *

UNITED STATES PATENT AND TRADEMARK OFFICE
CERTIFICATE OF CORRECTION

PATENT NO. : 8,119,236 B2
APPLICATION NO. : 12/533272
DATED : February 21, 2012
INVENTOR(S) : Katsuhiko Kamiya et al.

It is certified that error appears in the above-identified patent and that said Letters Patent is hereby corrected as shown below:

At Page 1 (Item 57), Abstract, Line 17, please change "hydroxl" to --hydroxyl--.

At Column 4, Line 33, change "8-hydrorxyoctyl" to --8-hydroxyoctyl--.

At Column 4, Line 39, change "2-acrylolyloxyethyl" to --2-acryloyloxyethyl--.

At Column 5, Line 31, change "hydroxl" to --hydroxyl--.

At Column 9, Line 50, change "0.5N/10" to --0.5 N/10--.

At Column 10, Line 7, change "5 N/1" to --5 N/10--.

At Column 10, Line 32, change "$r_2$," to --$r_1$,--.

At Column 11, Line 47, change "8-hydrorxyoctyl" to --8-hydroxyoctyl--.

At Column 12, Line 13, change "stylenesulfonic" to --styrenesulfonic--.

At Column 17, Line 40, change "polyprolylene," to --polypropylene,--.

At Column 20, Line 16, change "KAYARD" to --KAYARAD--.

At Column 20, Line 23, please change "A'" to --A'.--.

At Column 29, Line 53-54, in Claim 3, change "8-hydrorxyoctyl" to --8-hydroxyoctyl--.

At Column 29, Line 60, in Claim 4, change "2-acrylolyloxyethyl" to --2-acryloyloxyethyl--.

Signed and Sealed this
Seventh Day of August, 2012

David J. Kappos
*Director of the United States Patent and Trademark Office*